(12) United States Patent
Shimanouchi et al.

(10) Patent No.: US 8,901,709 B2
(45) Date of Patent: Dec. 2, 2014

(54) ELECTRICAL DEVICE HAVING MOVABLE ELECTRODE

(71) Applicant: Fujitsu Limited, Kawasaki (JP)

(72) Inventors: Takeaki Shimanouchi, Akashi (JP); Osamu Toyoda, Akashi (JP); Satoshi Ueda, Kakogawa (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/220,356

(22) Filed: Mar. 20, 2014

(65) Prior Publication Data

US 2014/0203403 A1    Jul. 24, 2014

Related U.S. Application Data

(63) Continuation of application No. PCT/JP2011/005837, filed on Oct. 19, 2011.

(51) Int. Cl.
| | |
|---|---|
| *H01L 21/02* | (2006.01) |
| *H01L 49/02* | (2006.01) |
| *H01L 21/687* | (2006.01) |
| *H01L 21/683* | (2006.01) |

(52) U.S. Cl.
CPC .............. *H01L 28/60* (2013.01); *H01L 21/687* (2013.01); *H01L 21/6835* (2013.01)
USPC ........................................................ 257/532

(58) Field of Classification Search
CPC .... H01L 28/60; H01L 21/687; H01L 21/6835
USPC ........................................................ 257/532
See application file for complete search history.

(56) References Cited

U.S. PATENT DOCUMENTS

| | | | | |
|---|---|---|---|---|
| 7,517,769 | B2 * | 4/2009 | Van Schuylenbergh et al. | 438/381 |
| 8,039,922 | B2 * | 10/2011 | Ni | 257/532 |
| 2003/0223176 | A1 | 12/2003 | Fujii | |
| 2005/0052821 | A1 | 3/2005 | Fujii | |
| 2013/0241012 | A1 * | 9/2013 | Pruemm et al. | 257/415 |

FOREIGN PATENT DOCUMENTS

| | | |
|---|---|---|
| EP | 1 343 190 A2 | 9/2003 |
| EP | 1 343 190 A3 | 4/2005 |
| JP | 2001-304868 A1 | 10/2001 |
| JP | 2003-264123 A1 | 9/2003 |
| JP | 2004-53839 A1 | 2/2004 |
| JP | 2006-147995 A1 | 6/2006 |

OTHER PUBLICATIONS

International Search Report for International Application No. PCT/JP2011/005837 dated Jan. 24, 2012.

* cited by examiner

*Primary Examiner* — Nicholas Tobergte
(74) *Attorney, Agent, or Firm* — Kratz, Quintos & Hanson, LLP

(57) ABSTRACT

A movable electric device includes: a first and second fixed electrodes formed on a support substrate, and having opposing electrode surfaces which are substantially perpendicular to the surface of the support substrate, and define a cavity therebetween; a movable member having a movable electrode having a first end disposed near the first fixed electrode and a second end disposed near the second fixed electrode, and bent spring member continuing from at least one of the first and second ends of the movable electrode, and including part which is bent in thickness direction of the movable electrode; and first and second anchors disposed on the support substrate and supporting the movable member at its opposite ends.

13 Claims, 20 Drawing Sheets

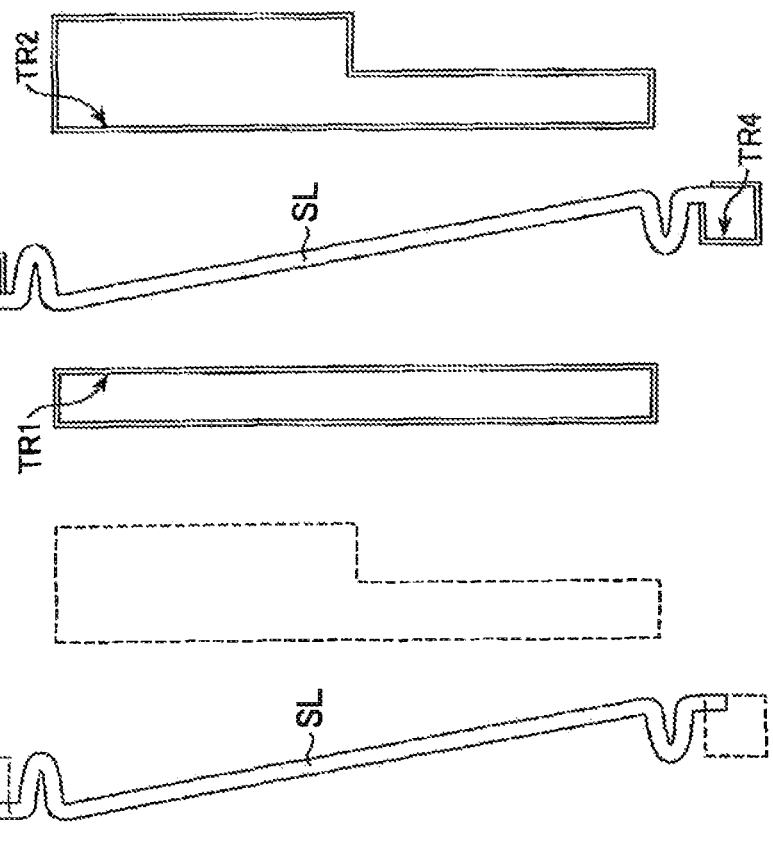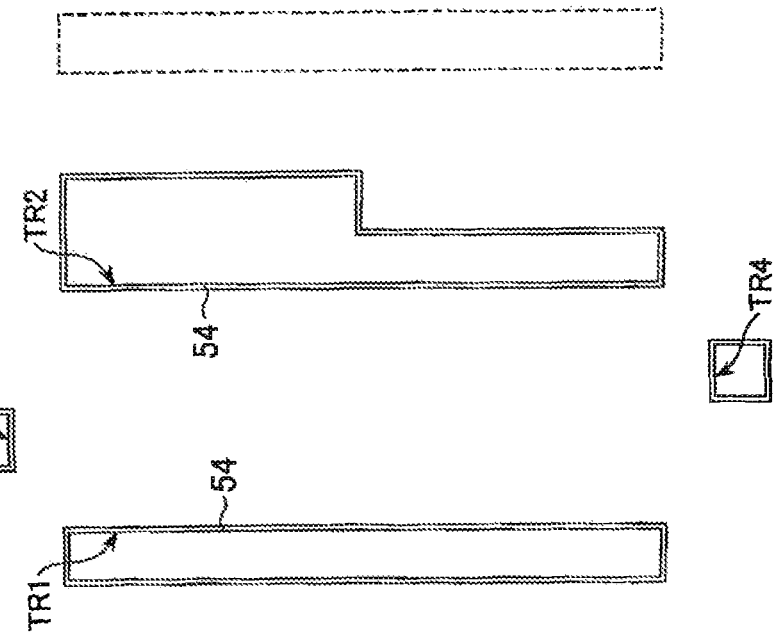

FIG. 9AP
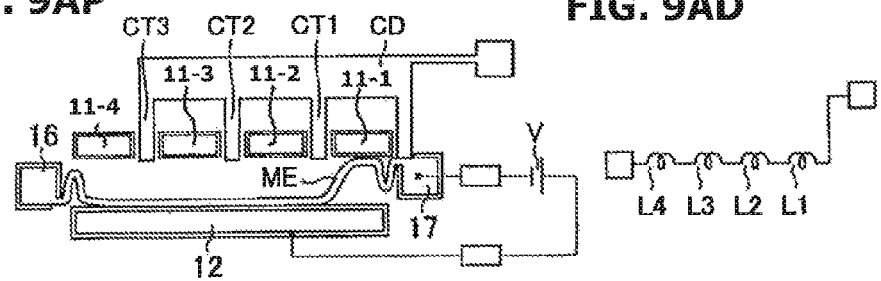
FIG. 9AD
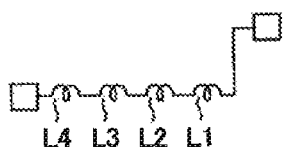
FIG. 9BP
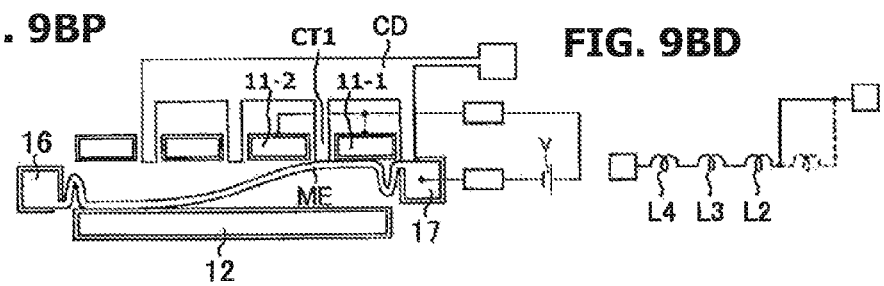
FIG. 9BD
FIG. 9CP
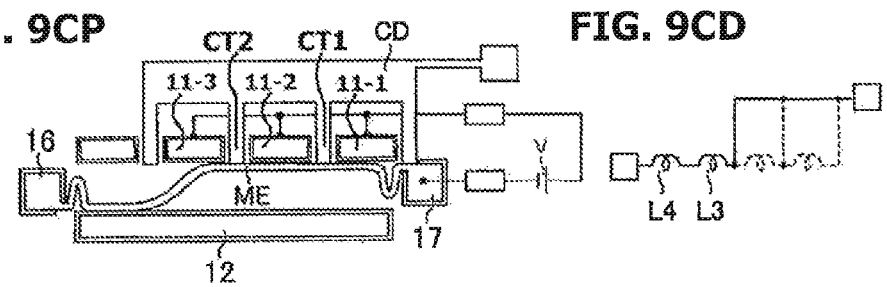
FIG. 9CD
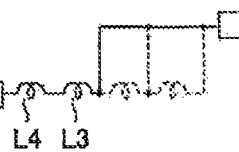
FIG. 9DP
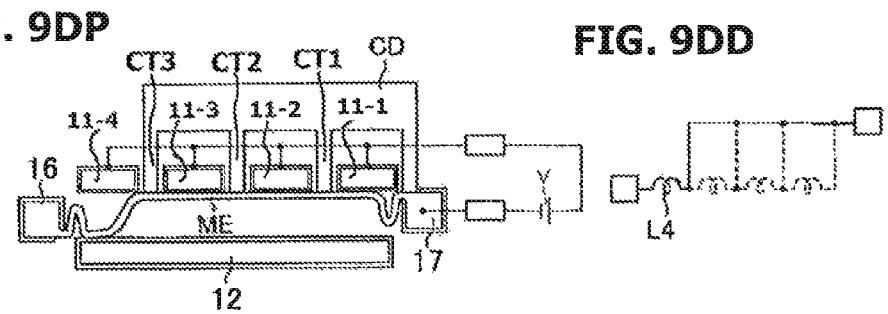
FIG. 9DD

ELECTRICAL DEVICE HAVING MOVABLE ELECTRODE

CROSS REFERENCE TO RELATED APPLICATIONS

This application is a continuation application of the prior International Application No. PCT/JP2011/005837, filed on Oct. 19, 2011, the entire contents of which are incorporated herein by reference. The subject matter of this application is related with the subject matter of earlier U.S. patent application Ser. No. 13/973,165, the entire contents of which are incorporated herein by reference.

FIELD

This invention relates to an electric device having a movable electrode.

BACKGROUND

Typical electric devices used in the radio frequency (RF) range of 500 MHz to 100 GHz in mobile phone, onboard radar, and the like include variable capacitance and switch.

Typically, a variable capacitance element has a structure including a fixed electrode and a movable electrode, wherein the movable electrode is displaced to change the capacitance. In order to prevent short circuiting, the surface of the fixed electrode is, for example covered with a dielectric insulating film. A switch can be formed by not covering the surface of the fixed electrode with a dielectric film and allowing the movable electrode to contact with the fixed electrode. The movable electrode can be piezoelectrically or electrostatically displaced. Reduction in size and weight is requested for a mobile electric device, and variable capacitance elements and switches using MEMS (micro electro-mechanical system) have been developed.

Such a structure is known wherein a fixed electrode is formed on the surface of a support substrate, and above the fixed electrode, a movable electrode opposing the surface of the fixed electrode is supported with an intervening flexible beam or the like. The capacitance is altered by controlling the distance between the electrodes. (See for example, JPA No. 2006-147995.)

FIG. 16A illustrates an example structure of variable capacitance device. The variable capacitance device is made of a variable capacitor having a parallel plate structure wherein one of the two electrodes is movable, and a casing for sealing the variable capacitor therein.

More specifically, a fixed electrode 103 in the form of a plane and anchors 106 for supporting a movable electrode are formed on a surface of a semiconductor substrate 101 such as a silicon substrate via an insulation layer 102. The anchors 106 support a plane-shaped movable electrode 104 above the fixed electrode 103 via U-shaped flexible beams 105. The flexible beams 105 have U-shaped beams disposed on the same plane as the movable electrode 104, and allow displacement in the normal direction to (the thickness direction of) the plane. Casing including side wall 110 and ceiling 111 is formed to surround the variable capacitor. The casing enables sealing the variable capacitor in an atmosphere such as an inert gas atmosphere of rare gas or in a reduced pressure atmosphere. When the casing is formed of metal, electrical shielding of the variable capacitor can be made.

When a voltage V is applied between the fixed electrode 103 and the movable electrode 104, the movable electrode 104 is attracted to the fixed electrode 103 by electrostatic force. When the movable electrode 104 is displaced to the side of the fixed electrode 103, the flexible beams 105 are distorted, and there is generated force of returning the movable electrode 104 in reverse direction by the restoration force proportional to the amount of displacement. The movable electrode 104 is displaced to a position where the electrostatic force and the restoration force are balanced, and the movable electrode 104 is retained at the balanced position as long as the voltage V is applied.

When the voltage V is reduced to zero, the movable electrode 104 returns to its original position by the restoration force of the flexible beam 105. Accordingly, the capacitor formed of the fixed electrode 103 and the movable electrode 104 functions as a variable capacitor whose electrostatic capacitance can be controlled by the applied voltage V.

FIG. 16B is a cross sectional view illustrating another example structure of variable capacitance element. A plane-shaped fixed electrode 103 is formed on a surface of a semiconductor substrate 101 such as a silicon substrate, via an insulation layer 102. An insulation layer 112 is formed on the insulation layer 102 to cover the fixed electrode 103. Anchors 106 are formed on the insulation layer 112, and support a plane-shaped movable electrode 104 above the fixed electrode 103 covered with the insulation layer 112 via flexible beams 105. Casing including side wall 110 and ceiling 111 is formed to surround the variable capacitor. Short-circuiting between the electrodes is avoided since the surface of the fixed electrode 103 is covered with the insulation layer 112.

In the case when the fixed electrode is covered with a dielectric insulation film, the dielectric film m be charged up after repeated on and off operations. This may result in the sticking phenomenon, in which separation of the movable electrode from the dielectric film becomes difficult. This problem has not been solved despite some countermeasure proposals including use of particular driving waveform.

When the envelope of radio frequency signal is modulated by signal waveform and is applied to the movable electrode, there may occur a phenomenon called self-actuation in which the movable electrode is moved by difference in the voltage based on the signal waveform. One method for preventing the self-actuation is to increase the driving voltage in accordance with the power of the introduced signal. Increasing the driving voltage causes easier occurrence of the sticking phenomenon. Also, a voltage boost circuit may be required to obtain higher voltage.

The electrode of a capacitor element can be formed not only in direction parallel with the substrate surface, but also in perpendicular to the substrate surface (for example, JPA No. 2001-304868). For example, a variable capacitance is formed by using an SOI (silicon-on-insulator) substrate having an active (single crystal) silicon layer formed above a support (single crystal) silicon substrate via a silicon oxide layer serving as a binding layer, and processing the active silicon layer to form a variable capacitance having an electrode perpendicular to the substrate surface.

The active silicon layer is doped with an impurity such as phosphorus or boron to reduce the resistance of the active silicon layer. A resist mask is formed on the active silicon layer. The active silicon layer is etched by reactive ion etching or the like to leave anchors, various comb-shaped electrodes, various pads, and the like on the silicon oxide layer. The comb-shaped electrodes are coupled to form a capacitance. The electrodes are formed perpendicular to the support silicon substrate.

The silicon oxide film can be removed by selective etching by hydrofluoric acid aqueous solution or the like to separate the active Si layer from the support Si substrate to provide freedom of displacement. Oscillator, beam, comb-shaped electrode, and the like can be formed. Aluminum or the like can be deposited on various pad to form electrode pad. Parts formed above the support substrate are formed of low resistance layer insulated from the support substrate, and oscillator, beam, comb-shaped electrode, and the like are located floating above the support substrate, and are oscillatably supported above the support substrate by the anchors.

SUMMARY

An object of the embodiment is to provide a movable electric device capable of suppressing the displacement of a movable electrode by thermal expansion.

An object of the embodiment is to provide a movable electric device capable of reducing the driving voltage required for driving a movable electrode.

According to an aspect of the embodiment, a movable electric device comprising includes:
  a support substrate having a surface;
  first and second fixed electrodes formed on the support substrate, and having opposing electrode surfaces which are substantially perpendicular to the surface of the support substrate, and define a cavity therebetween;
  a movable member having
    a movable electrode having a first end disposed near the first fixed electrode and a second end disposed near the second fixed electrode, and
    bent spring member continuing from at least one of the first and second ends of the movable electrode, and including part which is bent in thickness direction of the movable electrode; and
  first and second anchors disposed on the support substrate and supporting the movable member at its opposite ends.

The object and advantages of the invention will be realized and attained by means of the elements and combinations particularly pointed out in the claims.

It is to be understood that both the foregoing general description and the following detailed description are exemplary and are not restrictive of the invention, as claimed.

BRIEF DESCRIPTION OF THE DRAWINGS

FIGS. 5A to 5E are plan views of the states illustrated in FIGS. 4C, 4D, 4E, 4J, and 4K.

FIGS. 9AP to 9DP are plan views illustrating four states of the modification of the second embodiment wherein the multi-contact switch has been short circuited, and the movable electrode is used as an inductance element, and FIGS. 9AD to 9DD are equivalent circuit diagrams of the four states.

DESCRIPTION OF EMBODIMENTS

In digital type variable capacitance elements, the constituted capacitance is at the minimum (off state) when the movable electrode is separated from the fixed electrode, and the constituted capacitance is at the maximum (on state) when the movable electrode is in contact with the fixed electrode via a dielectric film. The variable capacitance is used in these two states. It is often necessary to set the capacitance ratio of the off state and the on state in a designed range.

Figure 1A:
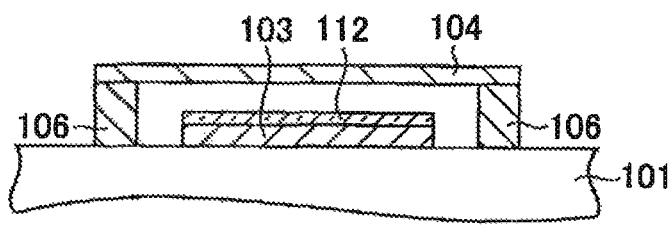
FIGS. 1A, 1B, and 1C are cross sectional views illustrating basic structure, basic movement, and behavior upon temperature increase of a variable capacitance element having a both-ends-supported beam structure.
Figure 1B:
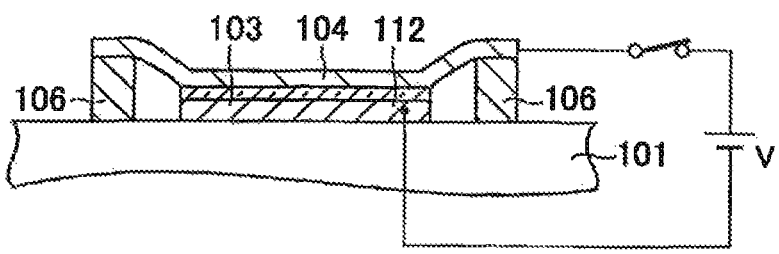
Figure 1C:
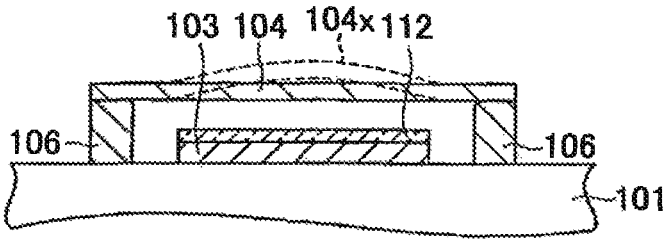

FIGS. 1A to 1C are cross sectional views illustrating three states of a variable capacitance element having simplified morphology. As illustrated in FIG. 1A, a fixed electrode 103 and an insulation layer 112 are laminated on a surface of a substrate 101, and anchors 106 supported on the substrate 101 has both-ends-supported structure and supports opposite ends of a movable electrode 104. The movable electrode 104 is separated from the insulation layer 112 on the fixed electrode 103, and is in off state.

As illustrated in FIG. 1B, when a direct current (dc) bias voltage V is applied between the fixed electrode 103 and the movable electrode 104, electrostatic attractive force is generated, and the movable electrode 104 is attracted to the fixed electrode 103 to fall in contact with the insulation layer 112. This is "on" state.

Assume the variable electrode 104 has a thermal expansion coefficient higher than that of the substrate 101, as in the case of metal variable electrode 104 and a semiconductor substrate 101.

As illustrated in FIG. 1C, the movable electrode 104 exhibits a thermal expansion larger than the substrate 101 upon increase in temperature. Thereby the length of the variable electrode 104 increases by the thermal expansion, and cannot be fully accommodated between the anchors 106. For releasing the stress, the movable electrode 104 is deformed, for example, into an upwardly displaced shape 104x to absorb the thermal expansion. Then, the distance between the movable electrode 104x and the fixed electrode 103 will be increased, and the capacitance in "off" state will be reduced. In a case where the beam of the movable electrode 104 is displaced downward to absorb the thermal expansion, the capacitance in "off" state will be increased.

In both cases, the capacitance in "off" state is changed from the designed value, and the intended circuit function may not be realized. In a case where the distance between the movable electrode and the fixed electrode is increased, the voltage required for attracting the movable electrode will be increased. The designed voltage may become insufficient to realize "on" state. Therefore, such a structure is desired that will keep the distance between the movable electrode and the fixed electrode even when expansion or contraction by the temperature change occurs.

Figure 1D:
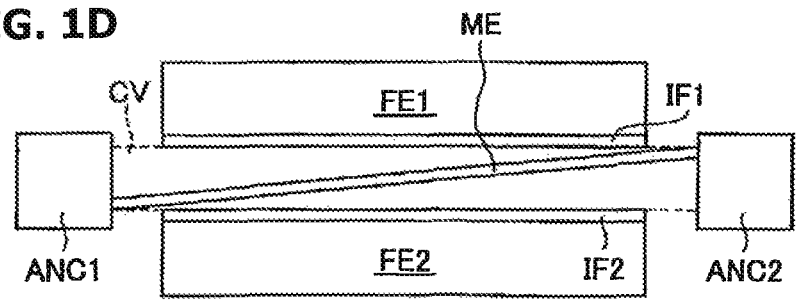
FIGS. 1D and 1E are a plan view and a cross sectional view of a variable capacitance element according previous proposal of the present inventors.
Figure 1E:
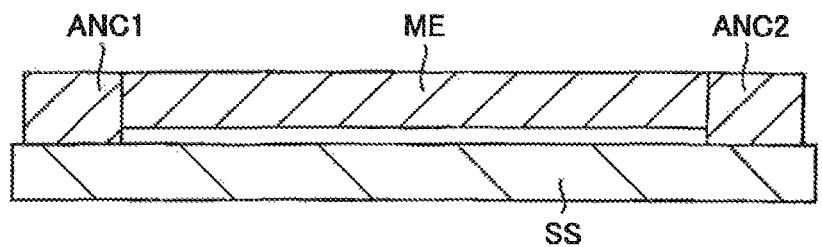

FIGS. 1D and 1E are a plan view and a cross sectional view of the variable capacitance element previously proposed by the present inventors. As illustrated in FIG. 1D, the movable electrode ME is obliquely disposed in a cavity CV, and the both ends are supported by anchor ANC1 and ANC2. As illustrated in FIG. 1E, the anchors ANC1 and ANC2 are fixed on a support substrate SS of SOI substrate, and the movable electrode ME is supported by the anchors ANC1 and ANC2 in a state upwardly separated from the support substrate SS.

As illustrated in FIG. 1D, first and second fixed electrodes FE1 and FE2 are disposed on side surfaces of the cavity CV, on both sides of the movable electrode ME. The first and second fixed electrodes FE1 and FE2 are disposed in parallel in such a manner that the movable electrode ME is near the first fixed electrode FE1 at the right end and is near the second fixed electrode FE2 at the left end. The electrostatic force between the opposing electrodes becomes stronger as the distance between the opposing electrodes becomes shorter.

In "on" state, the movable electrode ME is attracted to the first fixed electrode FE1 via an insulation film IF1, and in "off" state, the movable electrode ME is attracted to the second fixed electrode FE2 via an insulation film IF2. In both "on" and "off" states, the movable electrode is attracted to one of the fixed electrodes, and the capacitance becomes unchangeable. Both transfer from "off" state to "on" state and transfer from "on" state to "off" state are both positively performed by the electrostatic attraction by the voltage applied between the movable electrode and the first or second fixed electrode.

The movable electrode is obliquely disposed between the pair of fixed electrodes, and even in a case when the movable electrode is held in a state attracted to one fixed electrode, part of the movable electrode is kept near the other fixed electrode. In case the movable electrode ME is attracted to the first fixed electrode FE1, when a voltage is applied between the second fixed electrode FE2 and the movable electrode ME, strong electrostatic attraction is generated near the left end of the movable electrode ME between the movable electrode ME and the second fixed electrode FE2. Thus, it becomes easy to gradually separating the movable electrode ME from the first movable electrode FE1 from the left end of the movable electrode ME. In case the movable electrode ME is attracted to the second fixed electrode FE2, when a voltage is applied between the first fixed electrode FE1 and the movable electrode ME, it becomes easy to gradually separating the movable electrode ME from the second fixed electrode FE2 from the right end of the movable electrode ME by the same principle.

Even when the sticking phenomenon occurs in which the movable electrode is attracted to the fixed electrode and cannot be separated therefrom even after turning off the voltage, separation of the movable electrode is facilitated by utilizing the electrostatic attraction by applying voltage between the other fixed electrode and the movable electrode. Control of the sticking phenomenon is facilitated.

One of the first and second fixed electrodes may be a dummy electrode which does not function in an electric circuit. Of course, two fixed electrodes may be positively used by forming two variable capacitors which perform symmetrical "on"/"off" operation. In case plate-shaped electrodes are formed on a semiconductor substrate, formation of a movable electrode in oblique relationship to the surface of a fixed electrode would be not easy. However, in case an SOI substrate is used and electrodes are formed substantially perpendicular to the surface of the semiconductor substrate, an oblique electrode between parallel electrodes can be realized only by changing the pattern shape.

In FIG. 1D, when the movable electrode ME exhibits thermal expansion larger than that of the support substrate SS upon temperature rise, the movable electrode ME will be bent either upward or downward to absorb thermal expansion. The symmetrical characteristics of the movable electrode ME with respect to the first and second fixed electrodes FE1 and FE2 is biased to either one side. For example, the voltage required for initial driving is changed. The present inventors have studied incorporating structure capable of absorbing thermal expansion, in the previously proposed structure.

Variable capacitance elements according to the embodiments will be described hereinbelow, referring to the drawings.

Figure 2A:
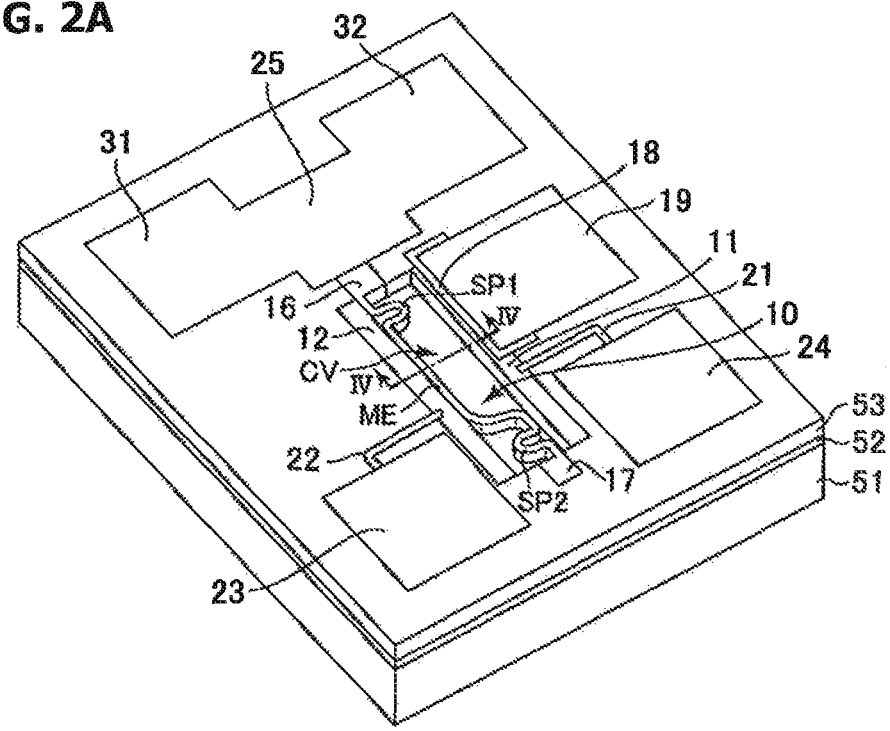
FIG. 2A is a perspective view schematically illustrating a variable capacitance element according to the first embodiment.

FIG. 2A is a schematic perspective view of a variable capacitance element according to the first embodiment. An SDI (silicon on insulator) substrate in which an active Si layer 53 is coupled to a support Si substrate 51 by a bonding silicon oxide film 52, is used. For example, the support Si substrate 51 has a thickness of 300 μm to 500 μm, and the bonding silicon oxide film 52 has a thickness of 2 μm to 7 μm. The active Si layer 53 is a single crystal Si layer having a high resistivity of at least 500 Ωcm, and has a thickness of 20 μm to 30 μm, for example 25 μm.

Fixed electrodes 11 and 12 are formed, embedding trenches extending through the full thickness of an active Si layer 53, with two opposing side surfaces extending in parallel. A movable member 10 is formed in the area between the fixed electrodes 11 and 12, embedding trenches extending through the entire thickness of the active Si layer 53 in the production process. The movable member 10 includes a movable electrode ME and bent spring members SP1 and SP2 continuing from the two ends of the movable electrode ME, bent from the extended plane of the movable electrode ME and curved to return to and existing again on the extended plane of the movable electrode. The movable member 10 is supported at both ends by anchors 16 and 17. Then, the active Si layer 53 between the fixed electrodes 11 and 12 and the underlying bonding silicon oxide film 52 are removed to form a cavity CV between the fixed electrodes 11 and 12 to provide freedom of the movable member 10.

The movable member 10 and the opposing side surfaces of the fixed electrodes 11 and 12 have the same height as the thickness of the active Si layer 53, in a range of 20 μm to 30 μm, for example, 25 μm. The fixed electrodes 11 and 12 have length of, for example, 500 μm, and are disposed to oppose at a distance of 20 μm. The movable electrode ME has a thickness of, for example, 2 μm to 5 μm, and a length longer than that of the fixed electrodes 11 and 12. The bent spring members SP1 and SP2 have, for example, the same thickness and the same width as those of the movable electrode ME.

Figure 2B:
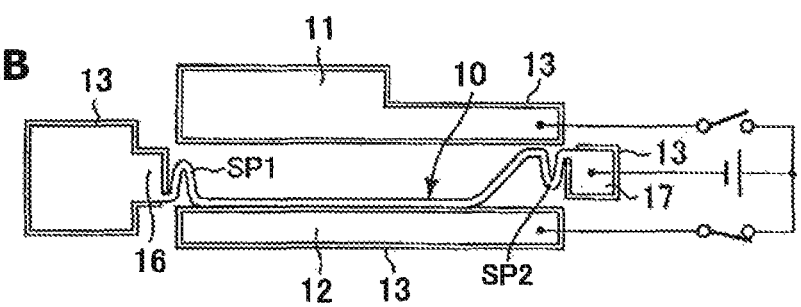
FIGS. 2B and 2C are plan views illustrating two operational states of the variable capacitance element.
Figure 2C:
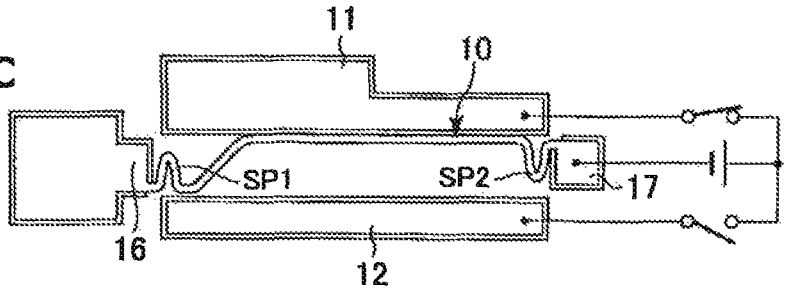

FIGS. 2B and 2C are plan views illustrating two operational states of the variable capacitance element. Referring to FIG. 2B, an insulation film 13 is formed on surfaces of the fixed electrodes to avoid short circuiting between the electrodes. For preventing short-circuiting, an insulation film 13 of silicon nitride, for example, is formed on surfaces of the fixed electrodes 11 and 12. In this embodiment, the insulation film 13 is also formed on the surfaces of the anchors 16 and 17 to enhance insulation between the electrodes of the variable capacitance and the surrounding active Si layer 53. No insulation film is formed on the surface of the movable electrode ME to secure flexibility of the movable electrode and avoid peeling-off of the insulation film.

The movable electrode ME is asymmetrically disposed between the side walls of the parallel fixed electrodes 11 and 12 in such a manner that the movable electrode ME is low on the left side and high on the right side in the drawings. The movable electrode ME is disposed to extend from lower end of the anchor 16 to upper end of the anchor 17 in the drawing. Namely, the left part of the movable electrode ME near the anchor 16 is disposed nearer to the fixed electrode 12 than to the fixed electrode 11, and the right part of the movable electrode ME near the anchor 17 is disposed nearer to the fixed electrode 11 than to the fixed electrode 12.

When a voltage is applied between the movable electrode ME and the fixed electrode 12, the movable electrode ME is attracted to the fixed electrode 12 by electrostatic attraction. The movable electrode ME is attracted to the fixed electrode 12 first at the left part of the movable electrode ME where the distance is short, and then the right part of the movable electrode ME is gradually attracted to the fixed electrode 12. Since the right end of the movable electrode ME is disposed nearer to the fixed electrode 11 than to the fixed electrode 12, the right end is separated from the fixed electrode 12.

Referring to FIG. 2C, when a voltage is applied between the movable electrode ME and the fixed electrode 11, the movable electrode ME is attracted to the fixed electrode 11 by electrostatic attraction. Since the right end of the movable electrode ME is disposed nearer to the fixed electrode 11 than to the fixed electrode 12, the right end is attracted to the fixed electrode 11, and the left part of the movable electrode ME is gradually attracted to the fixed electrode 11.

As described above, since the movable electrode is disposed obliquely between the parallel fixed electrodes 11 and 12 with one end near the fixed electrode 11 and the other end near the fixed electrode 12, the movable electrode includes part where attraction force can work effectively during the attraction to the fixed electrode 11 and another part where attraction force can work effectively during the attraction to the electrode 12. Hence, rapid configuration transfer of the movable electrode can be made.

Figure 3A:
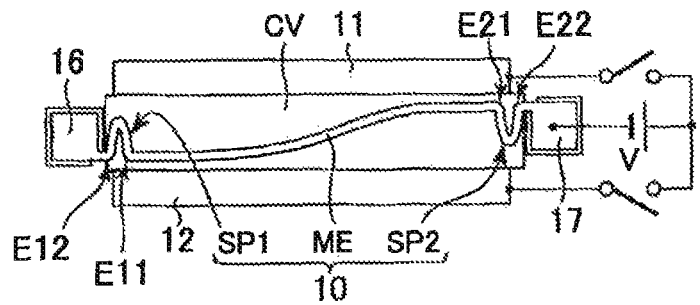
FIGS. 3A to 3F are plan views illustrating operation of the variable capacitance element according to the first embodiment.

As illustrated in FIG. 3A, the bent spring members SP1 and SP2 continue from the two ends of the plate-shaped movable electrode ME, and two other ends of the bent spring members SP1 and SP2 continue to the anchors 16 and 17. The bent spring members SP1 and SP2 are bent mutually in the reverse thickness direction from the plane defined by the movable electrode ME, are curved to, and exist again on the plane defined by the movable electrode ME. The end of the movable electrode ME transferring to the bent part SP1 is referred to as E11, and the end of the movable electrode ME transferring to the bent part SP2 is referred to as E21. The plate-shaped movable electrode ME, the bent spring members SP1 and SP2, and the anchors 16 and 17 which are continuous, are formed by embedding plate layers in the grooves formed in the active Si layer 53.

Figure 3B:
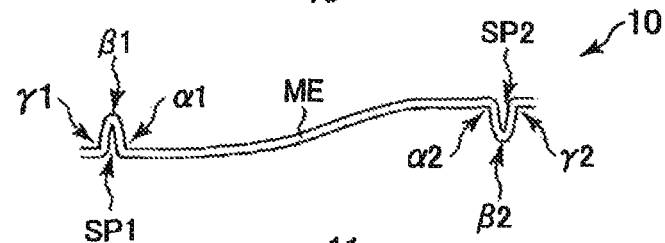

As illustrated in FIG. 3B, the movable member 10 has bents, of bent angles $\alpha 1$ and $\alpha 2$ in the region transferring from the movable electrode ME to the bent spring members SP1 and SP2, bent angles $\beta 1$ and $\beta 2$ in the intermediate portion of the bent spring members SP1 and SP2, and bent angles $\gamma 1$ and $\gamma 2$ at opposite ends of the bent spring members. The three bent angles $\alpha$, $\beta$, and $\gamma$ form one bent part. The bent angles change by the stress applied. For example, when an outward force is applied to the opposite ends of the bent part, $\beta$ increases by a particular angle, and each of $\alpha$ and $\gamma$ also increases by half of such angle. When an inward force is applied to the opposite ends of the bent part, width of the bent part is narrowed by angle changes which reduce the angles.

The force required to change the angle is generally smaller than the force required to change the length of the electrode itself. By changing the bent angle, length of the entire movable member 10 as well as relative angle of the bent spring members SP1 and SP2 in relation to the movable electrode ME can be changed. Compared with a case where the movable member is formed of a uniform rectangular plate, the length of such a movable member provided bent spring members connected to the two ends of a rectangular plate can be changed by a smaller stress, and the angles at the ends can also be changed.

Figure 3C:
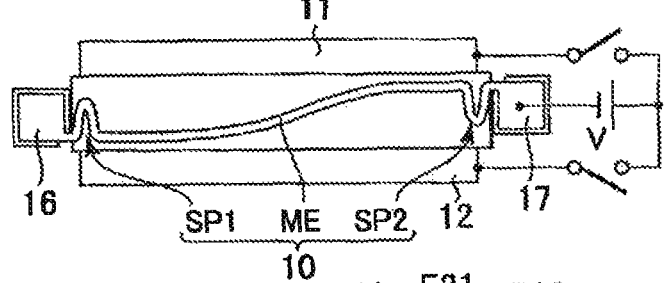

Case will be studied, as illustrated in FIG. 3C, where the movable member 10 and the substrate exhibit different thermal expansions upon temperature rise, and the movable member 10 tends to be relatively elongated between the fixed anchors 16 and 17. In such a case, the bent spring members SP1 and SP2 receive compressive stress from the movable electrode ME and the anchors 16 and 17. The bent angles $\alpha 1$ and $\beta 2$ will be decreased depending on the stress applied, and the movable member 10 can absorb the thermal expansion of the movable electrode ME. The bent angles $\alpha$ and $\gamma$ will be reduced by a half of the angle decrease of the bent angle $\beta$, and the extending direction of the movable electrode will be kept. When the movable member 10 exhibits relative contraction, the angles will be increased.

As described above, the change in the bent angle 3 can change the length of the bent spring members SP1 and SP2 in the extension direction of the movable electrode ME (hereinafter referred to as the spring length), to change the length of the movable member 10. The change in the bent angles $\alpha$ and $\gamma$ changes the relative angle of the bent spring members SP1 and SP2 with respect to the movable electrode ME and the anchors 16 and 17.

Figure 3D:
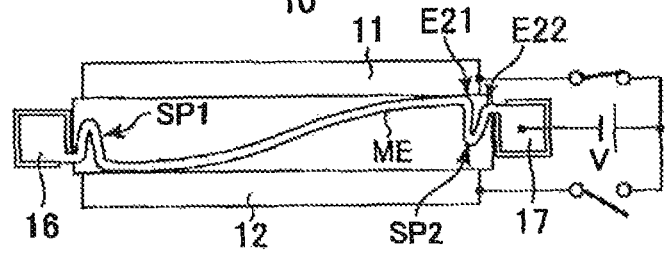

Consideration will be made on the case wherein a voltage is applied between the movable electrode and the fixed electrode 11 to generate electrostatic attraction, as illustrated in FIG. 3D. The movable electrode ME is nearer to the fixed electrode 11 at the right end than at the left end. The movable electrode ME receives strong electrostatic attraction from the fixed electrode 11 in the vicinity of the right end. When at least one of the bent angles $\alpha 2$ and $\gamma 2$ in the bent spring member SP2 increases, the right end of the movable electrode ME approaches to the fixed electrode 11. When the bent angle $\beta 2$ increases, the spring length of the bent spring member SP2 increases and the total length of the movable member 10 can be increased. Such changes of the angles in the bent spring member facilitates attraction of the right end of the movable electrode ME to the fixed electrode 11.

Electrostatic attraction increases as the distance between opposing electrodes becomes shorter. Once the right end of the movable electrode ME contacts the fixed electrode 11, the contact area between the movable electrode ME and the fixed electrode 11 widens from right to left, as in closure of a zipper. Such deformation often requires increase in the length of the movable member 10. Change in the length is facilitated by increase in angle β1 and corresponding changes in angles α1 and γ1 in the bent spring member SP1.

In the bent spring member SP1, end E11 continuing from the movable electrode ME can be preferably displaced in the width direction of the cavity perpendicular to the major surfaces of the fixed electrodes 11 and 12 (in the upward and downward direction in the drawing) by at least one third of the distance between the distance in the width direction of the cavity. When the displacement is at least one third, stable contact is established between the end E11 continuing from the movable electrode ME and the fixed electrode 12 by the pull-in phenomenon. When the displacement of the end E11 continuing from the movable electrode ME is insufficient, the part of the movable electrode ME that is brought in contact with the fixed electrode 12 will be smaller, and the effect of reducing the movable voltage will be insufficient.

Similarly, in the bent spring member SP2, the end E21 continuing from the movable electrode ME is preferably displaced in the width direction of the cavity perpendicular to the major surfaces of the fixed electrodes 11 and 12 (in the upward and downward directions in the drawing), at least by one third (⅓) of the distance in the width direction of the cavity between the end E22 continuing from the anchor 17 and the fixed electrode 11 in view of establishing stable contact between the end E21 continuing from the movable electrode ME and the fixed electrode 11.

In the movable electrode of the previous proposal having no bent spring member illustrated in FIG. 1D, the driving voltage of the movable electrode was 15V. In the sample of this embodiment having the bent spring members at opposite ends of the movable electrode, the driving voltage was reduced to 12V. It was demonstrated that this proposal is effectiveness in reducing the driving voltage.

Figure 3E:
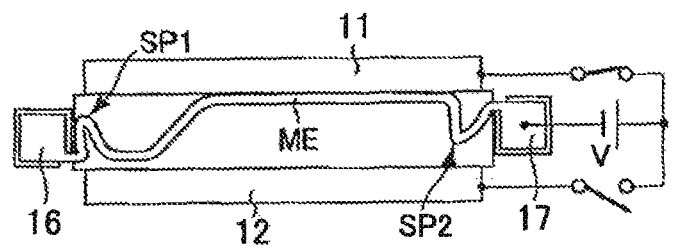

FIG. 3E illustrates "on" state when the movable electrode ME of the movable member 10 has approached most close to the fixed electrode 11. Even in this state, the left end of the movable electrode ME and the bent spring member SP1 are kept in state to be near the fixed electrode 12.

Figure 3F:
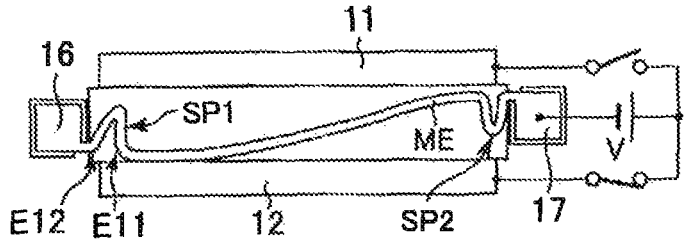

As illustrated in FIG. 3F, the voltage applied between the movable electrode ME and the fixed electrode 11 is turned off, and a voltage is applied between the movable electrode ME and the fixed electrode 12. Electrostatic attraction between the movable electrode ME and fixed electrode 11 disappears. Electrostatic attraction between the movable electrode ME, in particular, the left end, and the fixed electrode 12 is generated, and phenomenon similar to one that occurred at the bent spring member SP2 in FIG. 3D occurs at the bent spring member SP1, to attract the left end of the movable electrode ME to the fixed electrode 12. The contact area widens from the left to the right, and "off" state is established.

In FIG. 2A, movable electrode ME, bent spring members SP1 and SP2, fixed electrodes 11 and 12, and anchors 16 and 17 are comprised, for example, mainly of Au or Cu, and are made in the same plating step. A variable capacitance is composed of the fixed electrodes 11 and 12, the movable electrode ME, the bent spring members SP1 and SP2, and the anchors 16 and 17 supporting the movable member. On the upper surface of one fixed electrode 11 not opposing the movable electrode (on a side surface of the capacitance), a dielectric film 18 of silicon oxide, silicon nitride, alumina, or the like is formed to a thickness of 0.2 μm to 0.5 μm, and an electrode 19 mainly comprised of Au, Al, or the like is formed on the dielectric film 18, constituting a fixed capacitance.

Resistance elements 21 and 22 formed of Si—Cr alloy film extending from the upper surface of the fixed electrodes 11 and 12 to exterior are formed, and electrodes 23 and 24 are connected to the other ends of the resistance elements. The anchor 16 is connected to an electrode 25 between radio frequency signal lines 31 and 32.

Main processes of a method of manufacturing a semiconductor device including a variable capacitance element illustrated in FIG. 2A will be described hereinbelow, referring to FIGS. 4A to 4L. FIGS. 4A to 4L are cross sectional views along lines IV-IV of FIG. 2A.

Figure 4A:
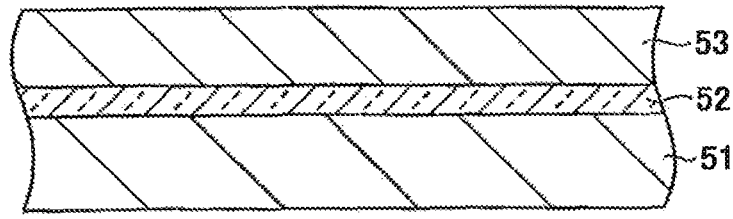
FIGS. 4A to 4L are cross sectional views illustrating manufacturing processes of the electronic device having a variable capacitance element according to the first embodiment.

As illustrated in FIG. 4A, a SOI substrate is prepared in which an active Si layer 53 having a high resistivity of at least 500 Ωcm and a thickness of 25 μm is bonded to a Si substrate 51 having a thickness of, for example, 300 μm to 500 μm via a bonding silicon oxide film 52 having a thickness of about 5 μm.

Figure 4B:
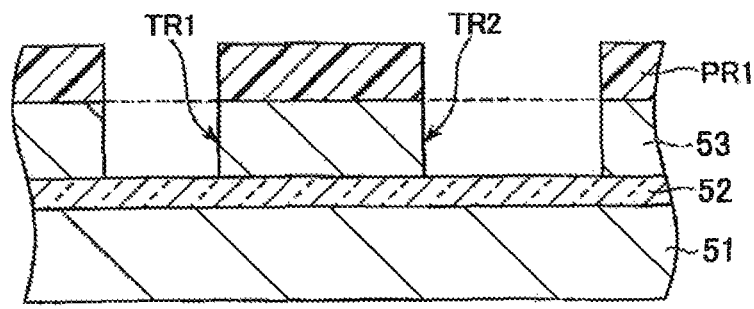

As illustrated in FIG. 4B, a resist pattern PR1 having openings defining trenches TR1 and TR2 for accommodating fixed electrodes are formed on the active Si layer 53. The resist pattern PR1 also has openings defining anchors. The entire thickness of the active Si layer 53 is etched by Deep RIE using the resist pattern as a mask. Deep RIE uses $CF_4$ ($+O_2$) and $SF_6$($+O_2$ or $+H_2$) as etching gas. The resist pattern PR1 is then removed.

As illustrated in FIG. 5A, the trenches TR1 and TR2 have parallel side surfaces having a length of 500 μm oppositely disposed at a distance of 20 μm. The trench TR2 on the right side has part with a larger width for forming a fixed capacitance thereon. The trenches TR3 and TR4 for forming anchors have structure for supporting a movable electrode between the fixed electrodes. An electrode is connected to the upper anchor (TR3).

Figure 4C:
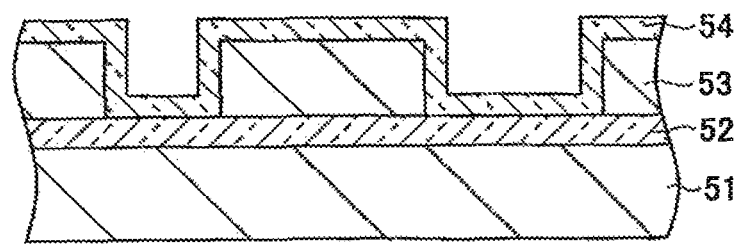

As illustrated in FIG. 4C, a silicon nitride film 54 having a thickness of 0.1 μm to 0.5 μm is formed on the surface of the substrate by CVD or low pressure (LP) CVD using a silane gas such as monosilane or disilane and ammonia gas. Exposed surfaces of the active Si layer 53 and the bonding silicon oxide film 52 are covered with the silicon nitride film 54. The silicon nitride film 54 functions as an insulation film covering the surfaces of the fixed electrodes. FIG. 5A illustrates the silicon nitride film 54 deposited on the surface of the trench in perspective manner.

Figure 4D:
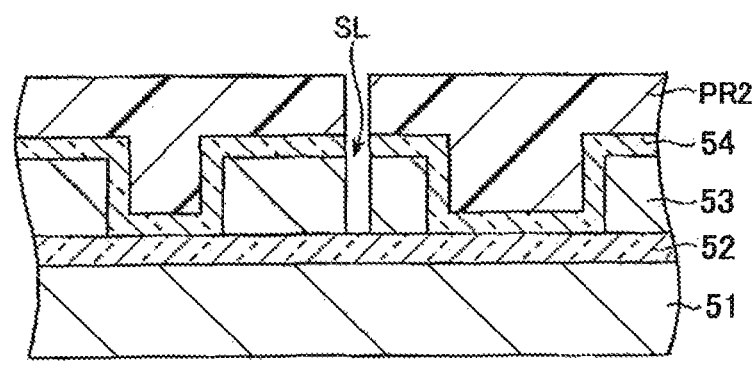

As illustrated in FIG. 4D, a resist pattern PR2 having an opening defining a movable member 10 is formed on the silicon nitride film 54, and the entire thickness of the silicon nitride film 54 and the active Si layer 53 exposed in the opening are etched by deep RIE to form a slit SL. FIG. 5B illustrates a plan shape of the opening. By forming the slit for the movable electrode after depositing the silicon nitride film 54, the movable electrode, the insulation film is not formed on the surface of the movable electrode. By partly overlapping the slit with part of the side wall of the trench for forming anchor, electric conduction between the movable electrode and the anchor is secured.

Figure 4E:
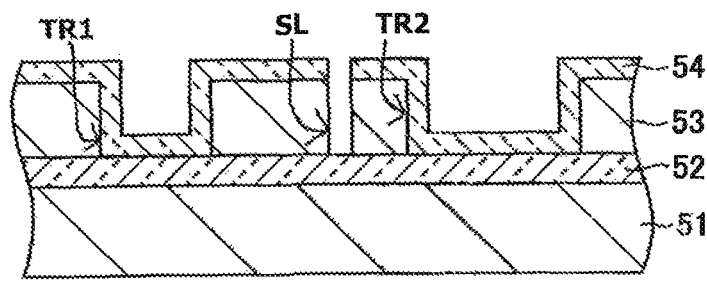

The resist pattern PR2 is removed, to form the state as illustrated in FIGS. 4E and 5C. In the trenches TR1 to TR4, total thickness of the active Si layer 53 is removed, and the silicon nitride film 54 is deposited on inner surfaces. The slit SL does not have the silicon nitride film 54, and it extends through the total thickness of the active Si layer 53, with a constant width, for example, of about 2

Figure 4F:
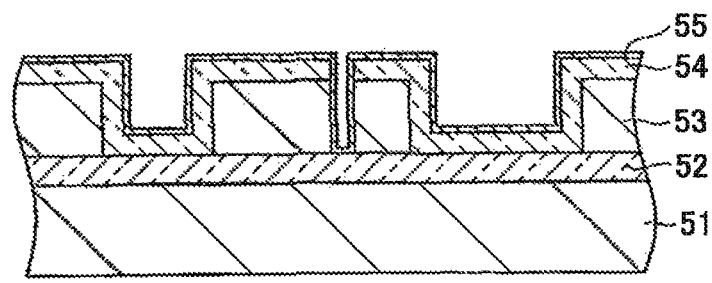

As illustrated in FIG. 4F, for example, a Ti layer is deposited on the surface of the substrate to a thickness of about 50 nm, and a Au layer is deposited on the Ti layer to a thickness of about 500 nm to form a seed layer. A Cr layer having a thickness of about 50 nm may be used instead of the Ti layer. The seed layer 55 functions as a current supply layer in the electrolytic plating.

Figure 4G:
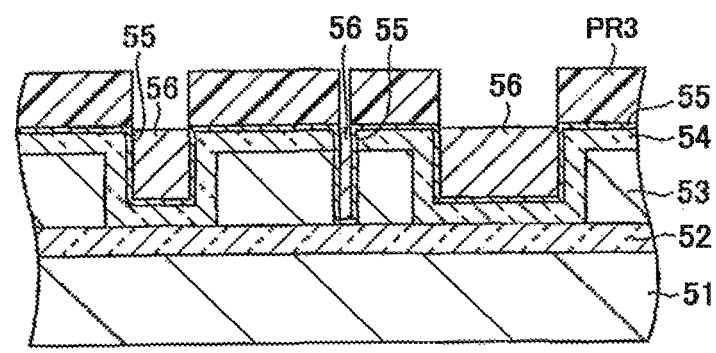

As illustrated in FIG. 4G, a resist pattern PR3 covering part of the seed layer 55 not requiring plating is formed, and an Au layer 56 is formed by electrolytic plating to fill the trenches TR and the slit SL. In this step, Cu layer may be formed by the electrolytic plating instead of Au layer. The resist pattern PR3 is removed, and exposed seed layer 55 is removed by etching, milling, or the like.

Figure 4H:
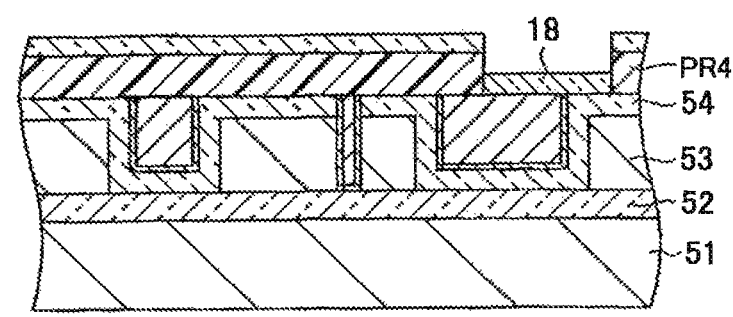

As illustrated in FIG. 4H, a resist pattern PR4 for patterning a dielectric film is formed on the substrate having the electrodes formed thereon. A dielectric film 18 of a silicon oxide film, a silicon nitride film, or an aluminum oxide film is deposited by sputtering to a thickness of 0.2 μm to 0.5 μm. The dielectric film deposited on the resist pattern PR4 is removed together with the resist pattern PR4 by lift-off.

Figure 4I:
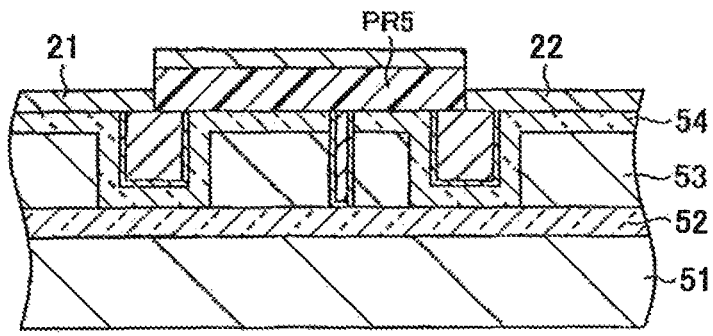

As illustrated in FIG. 4I, a resist pattern PR5 for patterning a resistance element is formed on the substrate from which the resist pattern PR4 has been removed. A Cr—Si alloy film is deposited by sputtering. The Cr—Si alloy film on the resist pattern PR5 is removed by lift-off. For example, a Si—Cr alloy film having a thickness of about 0.2 μm (sheet resistance, 300-600Ω square) is formed by using a sputtering target of Si (70-90) Cr (30-10) to form resistance elements 21 and 22. The resistance film may be formed before the formation of the dielectric film.

Figure 4J:
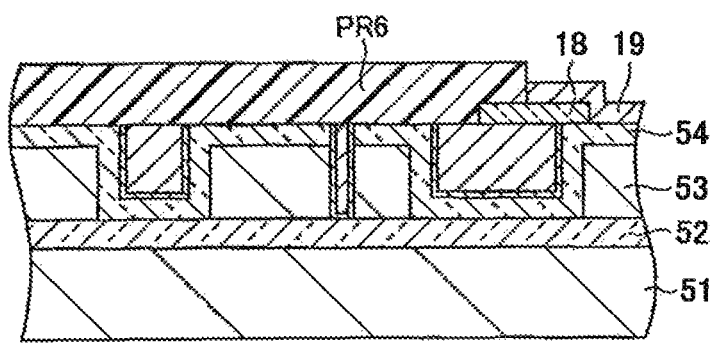
Figure 5E:
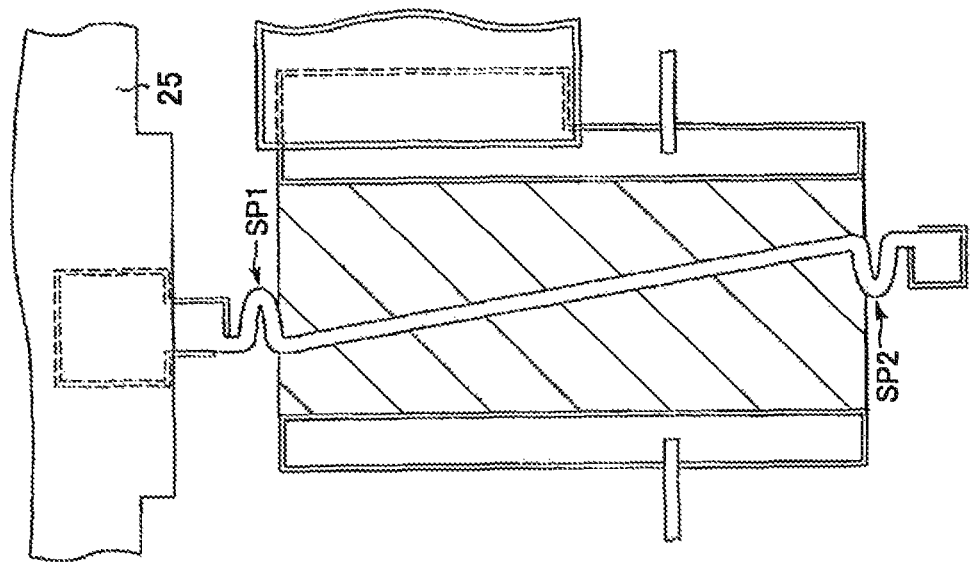
Figure 5D:
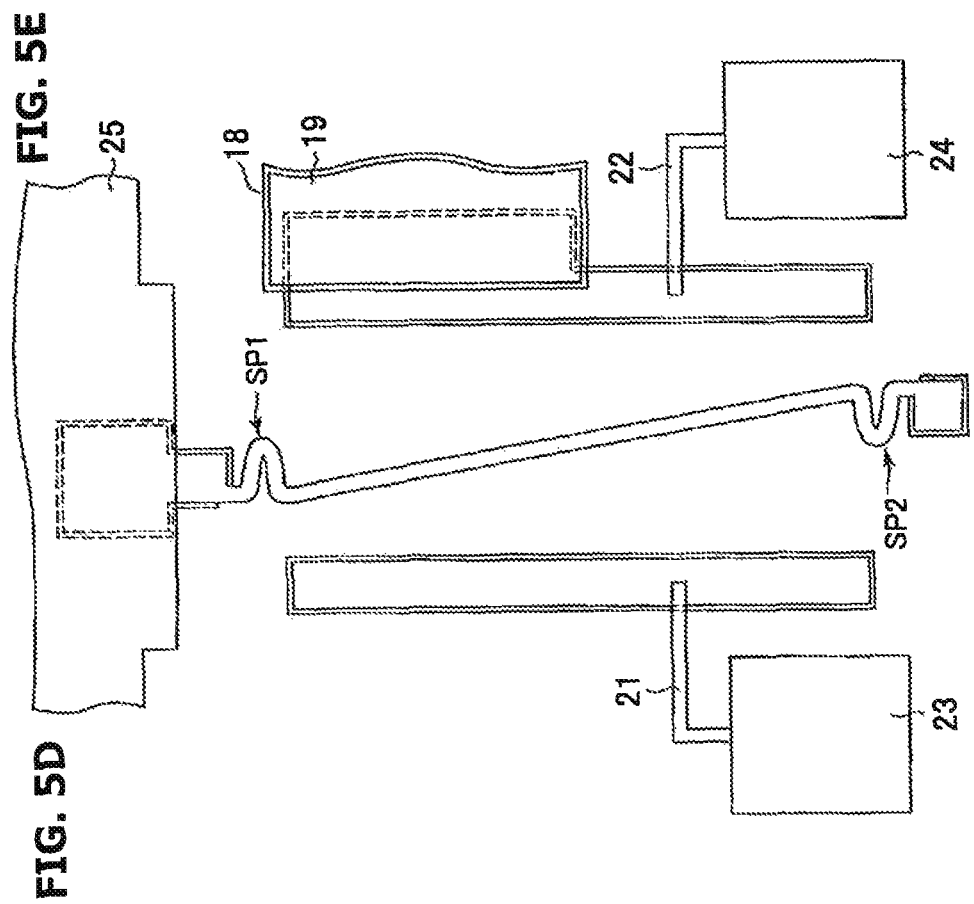

As illustrated in FIG. 4J, a resist pattern PR6 for patterning electrodes is formed on the substrate from which the resist pattern PR5 has been removed, and an electrode layer of a Ti/Au lamination or a Ti/Al lamination is formed to a thickness of about 1 μm by sputtering. The electrode layer on the resist pattern PR6 is removed by lift-off. Electrodes 19, 23, 24, and 25 illustrated in FIG. 5D are thus formed.

Figure 4K:
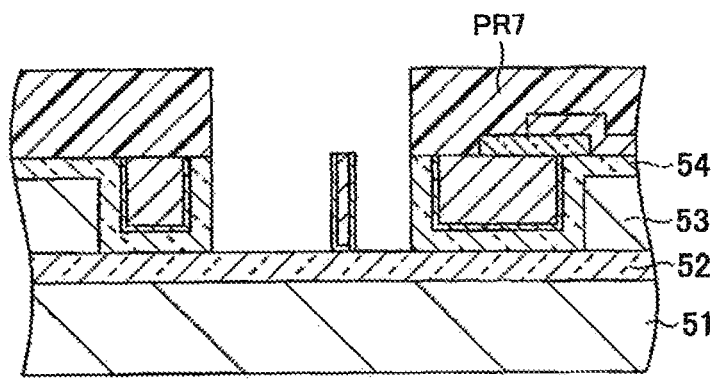

As illustrated in FIG. 4K, a resist pattern PR7 having opening corresponding to the area between the fixed electrodes is formed on the substrate, and the silicon nitride film 54 is etched by dry etching using $CHF_3$ gas, and exposed silicon layer is removed by deep RIE using $SF_6$ gas and $CF_4$ gas. The hatched area in FIG. 5E is the area to be etched.

Figure 4L:
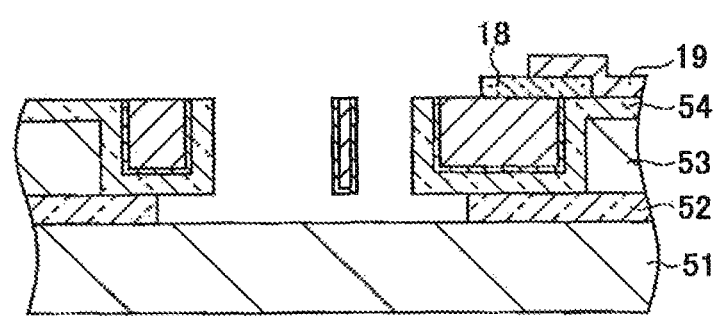

As illustrated in FIG. 4L, the exposed silicon oxide film 52 is removed by dry etching using $CF_4$ gas. Etching of silicon oxide film may also be done by wet etching using a buffered hydrofluoric acid or vapor phase etching using vapored hydrofluoric acid. When the silicon oxide film is removed by isotropic etching, the silicon oxide film in adjacent regions is removed by side etching. A semiconductor device having a variable capacitance as illustrated in FIG. 2A can be manufactured in this manner.

The variable capacitance exhibits capacitance change between the "on" state and the "off" state, for example, between approximately 0.9 pF ("off" state) and approximately 5.6 pF ("on" state).

Figure 6A:
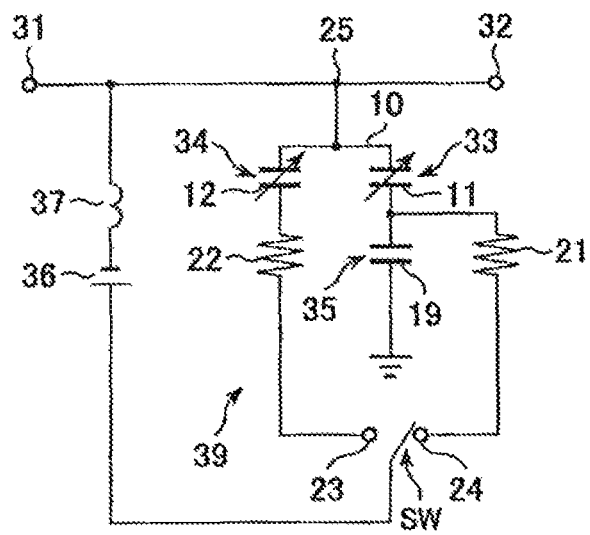
FIGS. 6A and 6B are equivalent circuit diagrams illustrating two modified circuits of the electronic device having a variable capacitance element.

FIG. 6A is an equivalent circuit diagram illustrating an example of an application circuit of the variable capacitance. A movable member 10 including a movable electrode ME is connected to the node 25 of radio frequency line 31-25-32, and variable capacitances 33 and 31 are formed between fixed electrodes 11 and 12. The fixed electrode 11 is grounded via a fixed capacitance 35, and connected to a terminal 24 of a switch SW via a resistance element 21. The other fixed electrode 12 is connected to the other terminal 23 of the switch SW via a resistance element 22 to constitute a variable capacitance circuit 39. Serial connection of a dc power source 36 and an inductor 37 is connected between the switch terminal of the switch SW and the radio frequency line. For substantially preventing high frequency leakage, it is preferable that the resistance elements 21 and 22 are at least 10 kΩ, and the inductor 37 is at least about 100 nH.

The variable capacitances 33 and 34 are connected to the radio frequency line 31-25-32, the fixed capacitance 35 is connected between the variable capacitance 33 and the ground, and the resistance elements 21 and 22 are connected between the variable capacitances 33 and 34 and external power source 36. The inductor 37 is connected between the other pole of the external power source 36 and the radio frequency line 31-25-32 to shield the radio frequency components. Leakage of the signal flowing through the radio frequency line 31-25-32 to the external power source 36 is prevented by the resistance elements 21 and 22. Short circuiting between the external power source and the ground is prevented by the fixed capacitance 35. One of the two digital states is selected by whether the movable electrode ME is attracted to the side of the fixed electrode 11 or to the side of the fixed electrode 12.

Figure 6B:
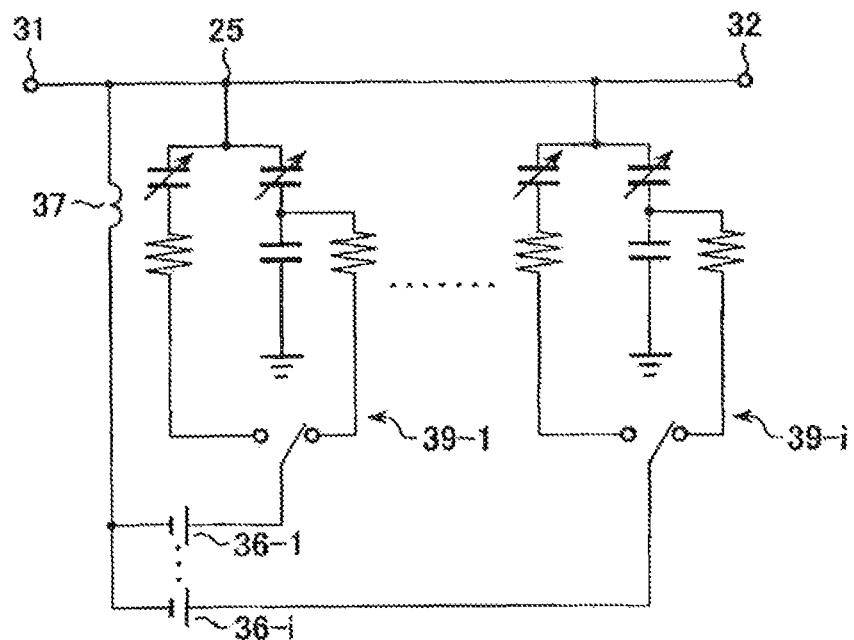

FIG. 6B is an equivalent circuit diagram illustrating another example of application circuit. A plurality of variable capacitance circuits 39-1, . . . 39-i are connected to the radio frequency line 31-25-32, and are connected to a common inductor 37 through external power sources 36-1, . . . 36-i. The plurality of variable capacitance circuits are different in the capacitance value, adapted for multi-bit circuit corresponding to a plurality of bits.

In the embodiment described above, the movable electrode is obliquely disposed in a space between the opposing fixed electrodes by adjusting the connection position between the anchors and the movable electrode to facilitate state change of the movable electrode. It is also possible to provide a stopper or stoppers for restricting movable area of the movable electrode.

Figure 7A:
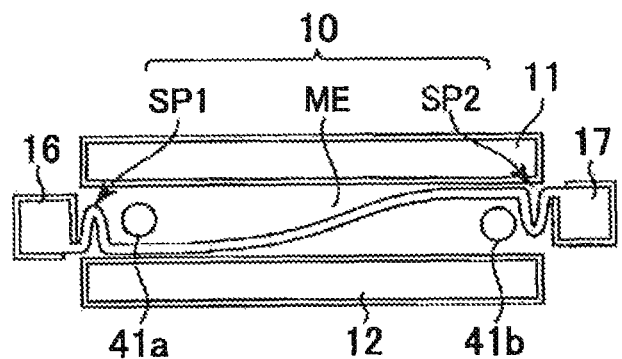
FIGS. 7A to 7C are schematic plan views illustrating a variable capacitance element provided with stoppers according to a modification of the first embodiment.

As illustrated in FIG. 7A, stoppers 41a and 41b are provided near the two ends of the movable electrode ME connected to bent spring members SP1 and SP2 supported by the anchors 16 and 17. Pair of the anchor 16 and the stopper 41a accommodates therebetween the bent spring member SP1 to ensure displacement and deformation of the bent spring member SP1. The stopper 41a also locates the left end of the movable electrode ME in a space near the fixed electrode 12. Pair of the stopper 41b and the anchor 17 accommodates the bent spring member SP2 to ensure the displacement and deformation of the bent spring member SP2. The stopper 41b also locates the right end of the movable electrode ME in a space near the fixed electrode 11.

Figure 7B:
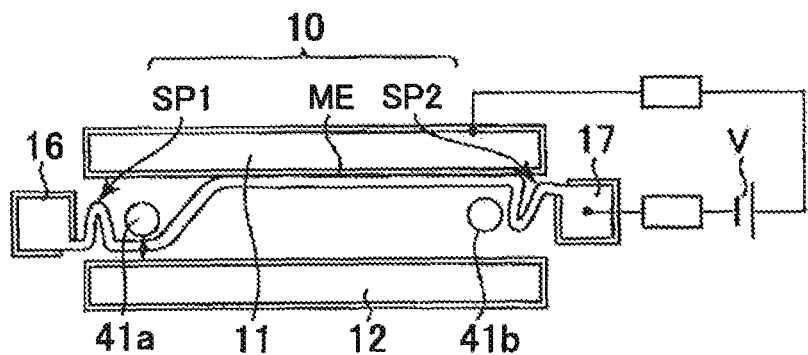

As illustrated in FIG. 7B, a bias voltage V is applied between the movable electrode ME and the upper fixed electrode 11 to generate electrostatic attraction between the movable electrode ME and the fixed electrode 11. The movable electrode ME receives strong electrostatic attraction in a right end part near the upper fixed electrode 11, and is attracted to the upper fixed electrode. In a left end part where the movable electrode ME is near the lower fixed electrode 12, the stopper 41a is located between the movable electrode ME and the upper fixed electrode 11 to thereby prevent the movable electrode ME from approaching the upper fixed electrode 11 and ensure an area where the movable electrode ME is disposed opposing the lower fixed electrode 12 via a small gap.

Figure 7C:
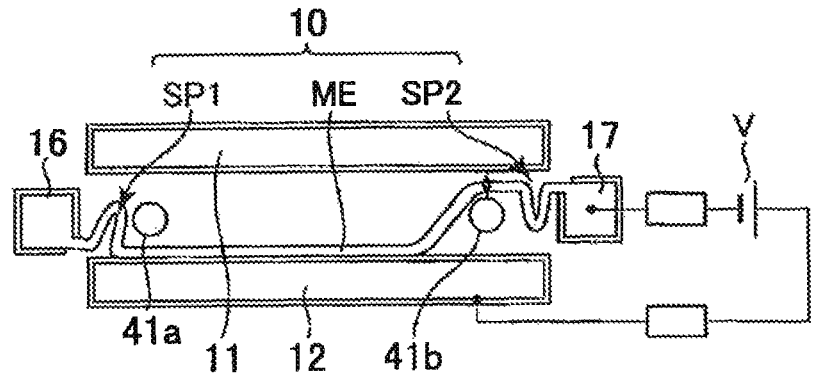

As illustrated in FIG. 7C, a bias voltage V is applied between the movable electrode ME and the lower fixed electrode 12 to generate electrostatic attraction between the movable electrode ME and the fixed electrode 12. The movable electrode ME receives strong electrostatic attraction in a left end part near the lower fixed electrode 12, and is attracted to the lower fixed electrode. In a right end part where the movable electrode ME is near the upper fixed electrode 11, the stopper 41b is located between the movable electrode ME and the lower fixed electrode 12 to thereby prevent the movable electrode ME from approaching the lower fixed electrode 12 and ensure an area where the movable electrode ME is disposed opposing the upper fixed electrode 11 via a small gap.

By ensuring a width where the movable electrode is disposed near each of the fixed electrodes, driving force would be stably applied to the movable electrode in either of driving modes. The stopper 41 can be formed by changing the pattern used in the etching process illustrated in FIG. 4B. In the step illustrated in FIGS. 4C and 5A, an insulation film is formed on the surface of the stopper. Illustration is made on the case of using circular cylindrical stoppers, the stopper is not limited to such shape and stoppers of other shapes are possible, provided that excessive stress is not generated at positions where the stopper and the movable electrode abut.

It is possible to form a switch with a movable electrode and a fixed electrode by not forming an insulation layer on the surface of the fixed electrode. It is also possible to form a driving stationary electrode and a switch contact. It is also possible to form a variable inductance by forming a multi-contact switch.

Figure 8A:
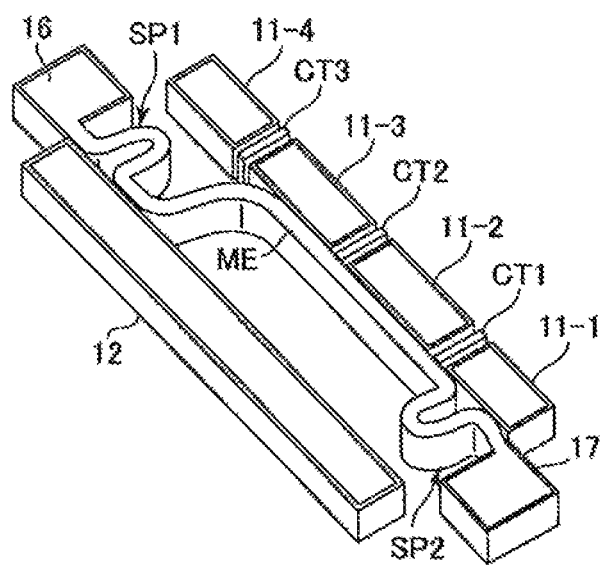
FIG. 8A is a perspective view schematically illustrating the electric device having a multi-contact switch according to the second embodiment, and FIGS. 8BP to 8EP are plan views illustrating four states of the multi-contact switch, and FIGS. 8BD to 8ED are equivalent circuit diagrams of the four states of the multi-contact switch.

FIG. 8A illustrates an example structure of a multi-contact switch according to the second embodiment. Description will be made mainly on the differences between this embodiment and the variable capacitance element illustrated in FIGS. 2A, 2B, and 2C. As in the case of the embodiment of FIGS. 2A to 2C, a movable member including a movable electrode ME and bent spring members SP1 and SP2 at the two ends of the movable electrode ME is supported between anchors 16 and 17, and a second fixed electrode 12 is disposed opposing one side surface of the movable member. A first fixed electrode 11 is divided into four sections 11-1, 11-2, 11-3, and 11-4, and each section can be selectively connected to a driving voltage. Contacts CT1, CT2, and CT3 having exposed conductor are disposed between adjacent sections of the movable electrode. In this structure, when the movable electrode ME is gradually attracted to the fixed electrode 11, the contacts CT1, CT2, and CT3 are successively contacted with the movable electrode ME.

Figure 8B:
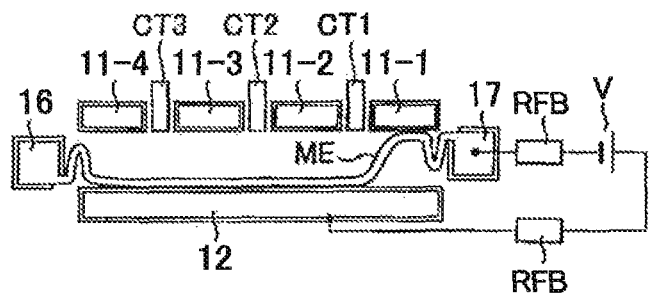
Figure 8B:
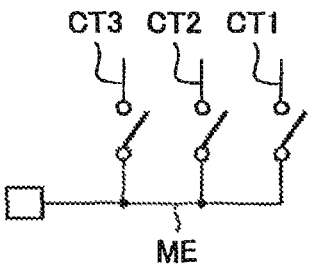

FIG. 8BP illustrates a case where the movable electrode ME is attracted to the second fixed electrode 12, and all of the contacts CT1, CT2, and CT3 are open ("off"). FIG. 8BD is an equivalent circuit illustrating this state. Radio frequency block RFB such as resistance or inductance component L is connected between the switch and a voltage source V.

Figure 8C:
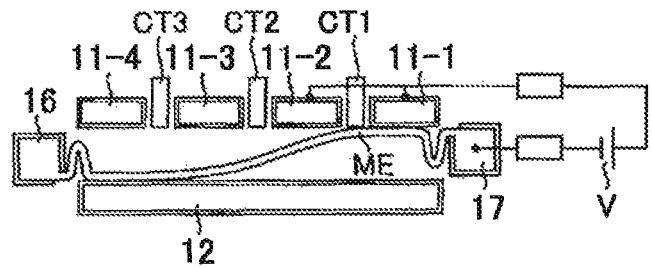
Figure 8C:
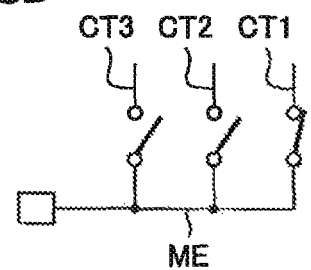

FIG. 8CP illustrates a case where the movable electrode ME is attracted to first and second sections 11-1 and 11-2 of the first fixed electrode 11 to drive the contact CT1 to close ("on"). FIG. 8CD is an equivalent circuit illustrating this state.

Figure 8D:
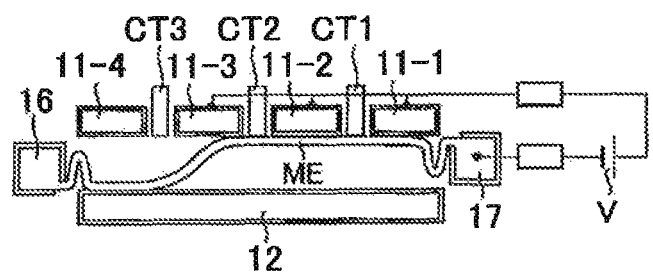
Figure 8D:
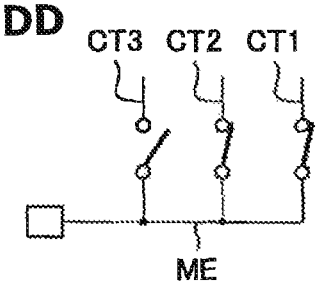

FIG. 8DP illustrates a case where the movable electrode ME is attracted to first, second, and third sections 11-1, 11-2, and 11-3 of the first fixed electrode 11 to drive the contacts CT1 and CT2 to close ("on"). FIG. 8DD is an equivalent circuit illustrating this state.

Figure 8E:
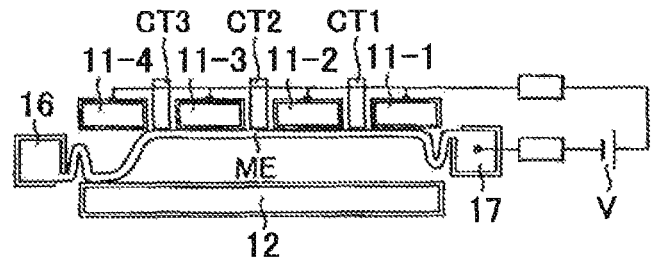
Figure 8E:
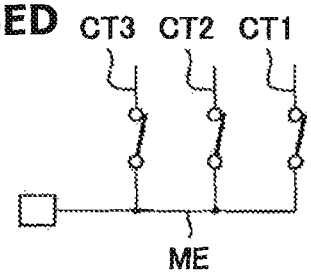

FIG. 8EP illustrates a case where the movable electrode ME is attracted to all of first to fourth sections 11-1 to 11-4 of the first fixed electrode 11 to drive the contacts CT1 to CT3 close ("on"). FIG. 8ED is an equivalent circuit illustrating this state.

Description has been made on the case wherein the contacts CT1, CT2, and CT3 are successively turned on. It is possible to successively turn off the contacts CT3, CT2, and CT1. Such multi-contact element wherein the plurality of contacts are successively turned on or off can be used, for example, in changing the number of stages in a multi-stage circuit. Description will be made hereinafter on the case of forming a variable inductance using a multi-contact element.

As illustrated in FIG. 9AP, a plurality of contacts CT1, CT2, and CT3 are short-circuited by a good electric conductor CD. The movable electrode ME is used as a low inductance element, the inductance of the movable electrode ME is divided into four inductors L1, L2, L3, and L4, and the four inductors can be successively short-circuited and recovered. FIG. 9AP illustrates a state where the movable electrode ME is attracted to the second fixed electrode 12, and the contacts CT1, CT2, and CT3 are all off. FIG. 9AD is an equivalent circuit diagram illustrating this state. The four inductors L1, L2, L3, and L4 are serially connected between the terminals.

FIG. 9BP illustrates a state where a driving voltage V is applied between the movable electrode ME and first and second sections 11-1 and 11-2 of the fixed electrode 11, to bring the movable electrode ME in contact with the contact CT1. One inductor L1 of the movable electrode ME is short-circuited by the good conductor CD. FIG. 9BD is an equivalent circuit diagram illustrating this state. Three inductors L2, L3, and L4 of the movable electrode are serially connected between the terminals.

FIG. 9CP illustrates a case where a driving voltage V is applied between the movable electrode ME and the first, the second, and the third sections 114, 11-2, and 11-3 of the fixed electrode 11, and the movable electrode ME is brought in contact with the contacts CT1 and CT2. Two inductors L1 and L2 of the movable electrode ME are short circuited by the good conductor CD. FIG. 9CD is an equivalent circuit diagram illustrating this state. Two inductors L3, and L4 of the movable electrode are serially connected between the terminals.

FIG. 9DP illustrates a state where a driving voltage V is applied between the movable electrode ME and all sections 114 to 11-4 of the fixed electrode 11, to bring the movable electrode ME in contact with the contacts CT1, CT2, and CT3. Three inductors L1, L2, and L3 of the movable electrode ME are short-circuited by the good conductor CD. FIG. 9DD is an equivalent circuit diagram illustrating this state. Only one inductor L4 of the movable electrode is connected between the terminals.

Realization of a high inductance by a movable electrode would be difficult. It becomes possible to form a variable inductor of a high inductance by externally connecting an inductance element.

Figure 10A:
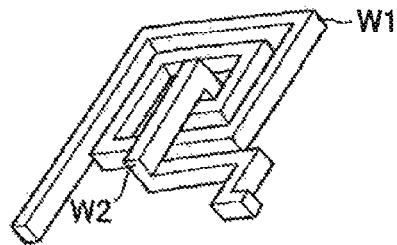
FIG. 10A is a perspective view illustrating the inductance element, FIG. 10BP-10EP are plan views illustrating four states of the modification of the second embodiment wherein the multi-contact switch is connected to the nodes of serially connected inductance elements, and FIGS. 10BD-10ED are equivalent circuit diagrams of the four states.

As illustrated in FIG. 10A, a coil is formed by double-layered wiring. A spiral coil and a lead wire is formed by the first layer wiring W1, and a lead wire from the inner terminal of the spiral coil is formed by the second layer wiring W2.

Figure 10B:
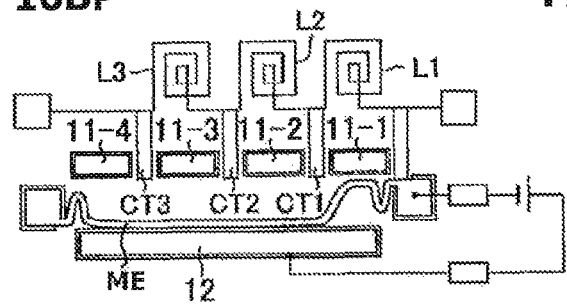
Figure 10B:
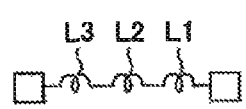

FIG. 10BP illustrates a structure wherein three high inductor elements L1, L2, and L3 are serially connected between the terminals, and interconnection nodes are connected to contacts CT1, CT2, and CT3. In this structure, the movable electrode functions as low resistance and low inductance. The movable electrode ME is attracted to the second fixed electrode 12. The contacts CT1 to CT3 are open ("off"), and the high inductors L1, L2, and L3 are serially connected between the terminals. FIG. 10BD is an equivalent circuit diagram illustrating this state.

Figure 10C:
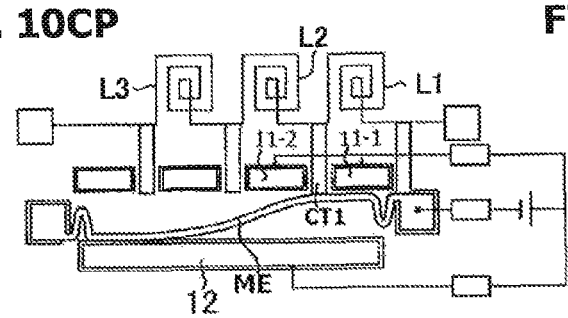
Figure 10C:
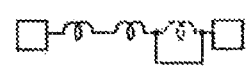

FIG. 10CP illustrates a case where a driving voltage V is applied between the movable electrode ME and first and second sections 11-1 and 11-2 of the fixed electrode 11 to bring the movable electrode ME in contact with the contact CT1. The high inductor element L1 is short-circuited by the low inductance of the movable electrode ME. FIG. 10CD is an equivalent circuit diagram illustrating this state.

Figure 10D:
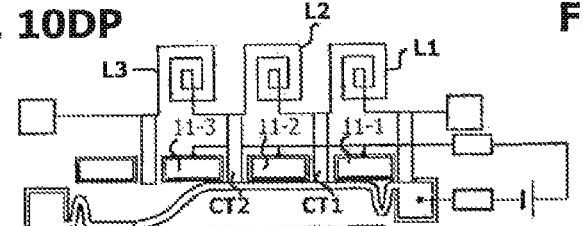
Figure 10D:

FIG. 10DP illustrates a case where a driving voltage V is applied between the movable electrode ME and first, second, and third sections 11-1, 11-2, and 11-3 of the fixed electrode 11 to bring the movable electrode ME in contact with the contacts CT1 and CT2. The high inductor elements L1 and L2 are short-circuited by the low inductance of the movable electrode ME. FIG. 10DD is an equivalent circuit diagram illustrating this state.

Figure 10E:
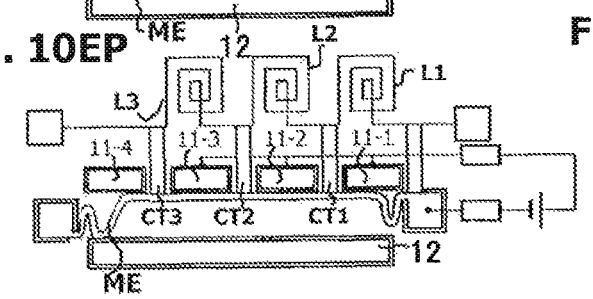
Figure 10E:
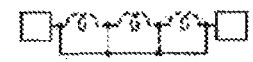

FIG. 10EP illustrates a case where a driving voltage V is applied between the movable electrode ME and all sections 11-1 to 11-4 of the fixed electrode 11 to bring the movable electrode ME in contact with the contacts CT1, CT2, and CT3. The high inductor elements L1, L2, and L3 are short-circuited by the low inductance of the movable electrode ME. FIG. 10ED is an equivalent circuit diagram illustrating this state.

FIGS. 11A to 11E are schematic cross sectional views illustrating manufacturing processes of a high inductor element.

Figure 11A:
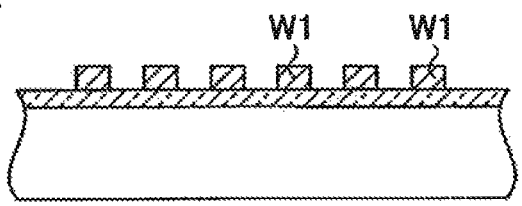
FIGS. 11A to 11E are schematic cross sectional views illustrating manufacturing processes of the high inductance element.

As illustrated in FIG. 11A, a coil-shaped wiring W1 is formed by patterning a first wiring layer on a substrate having an insulating surface. The first wiring layer is formed, for example, by an Au or Cu layer. For example, a seed layer is formed on the substrate by sputtering, etc., a resist pattern having opening corresponding to a wiring pattern is formed thereon, and an Au or Cu layer is electrolytically plated in the opening. Thereafter the resist pattern is removed, and exposed seed layer is removed by etching, milling, etc.

Figure 11B:
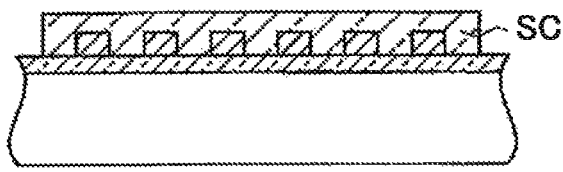

As illustrated in FIG. 11B, a sacrificial layer SC is formed, embeding the first wiring layer. For example, a silicon oxide layer if formed by chemical vapor deposition (CVD).

Figure 11C:
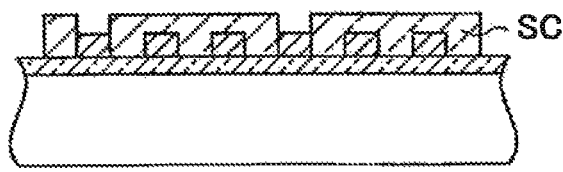

As illustrated in FIG. 11C, an opening is formed in a connecting region of the first wiring layer W1. For example, a resist pattern is formed on the sacrificial layer, and the sacrificial layer exposed in opening is reactively etched to expose the first wiring layer. Thereafter, the resist pattern is removed.

Figure 11D:
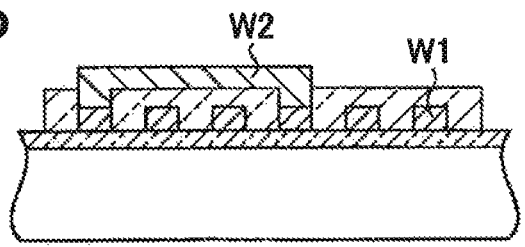

As illustrated in FIG. 11D, a second wiring layer is patterned to form an upper electrode. For example, after forming a seed layer, a resist pattern is formed and Au or Cu is electrolytically plated in opening of the resist pattern. Thereafter, the resist pattern is removed, and exposed seed layer is removed.

Figure 11E:
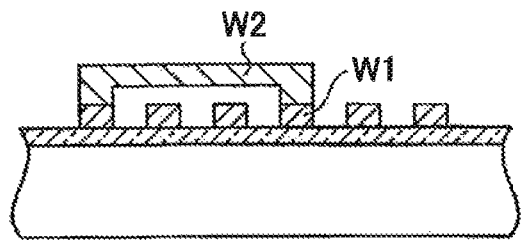

As illustrated in FIG. 11E, the sacrificial layer is removed. For example, the silicon oxide layer is removed by wet etching of hydrofluoric acid.

In the foregoing description, material, shape, size, etc. are given only for exemplary purposes, and unless otherwise specified, they are in no way limitative. For example, the bent spring member is not limited to the structure including three bent angles, although the bent spring member having such structure has been described.

Figure 12A:
FIGS. 12A to 12E are diagrams illustrating the shape of the movable member according to various modifications.

FIG. 12A illustrates a case where bent spring members SP1 and SP2 continue from opposite ends of a movable electrode ME, and are bent not in one go-and-return but in two go-and-returns. Basically, increase in the number of bending results in the easier deformation, and the number of bending of the bent spring member may be arbitrarily selected.

Figure 12B:

In FIG. 12B, the bending of the bent spring members SP1 and SP2 is less than one go-and-return. The bending is set to be 0.75 go-and-return, and the widthwise positions of the two ends of the bent spring member are aligned. For aligning the widthwise positions of the two ends, the number of bending is not limited to 0.75 go-and-return, but may be, for example, 1.25, 1.75, and 2.25 go-and-returns. Symmetric arrangement of the anchors and the movable member can be facilitated.

Figure 12C:
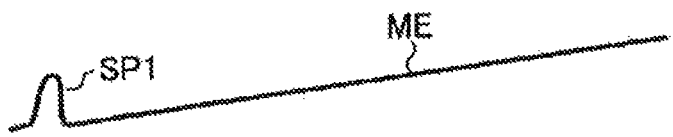

In FIG. 12C, the bent spring member SP1 is formed only at one end of the movable electrode ME, and there is no bent spring member on the other end. This structure is fitted for a case where there is some limitation in the area where the movable member is disposed. There will be some difference between the properties in the "on" and "off" states. Such difference may often cause no problem.

Figure 12D:
Figure 12E:

FIGS. 12D and 12E are examples wherein change in the direction of the bent spring members occur gradually. Bent angles $\alpha$, $\beta$, and $\gamma$ cannot be defined, but similar function is available.

In the foregoing description, embodiments of variable capacitance element and the variable inductance element have been described. Various radio frequency elements can be formed by using these elements.

Figure 13A:
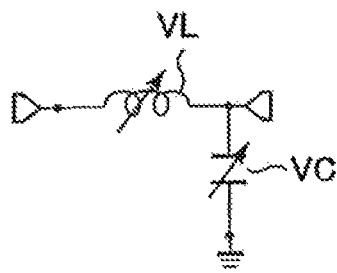
FIGS. 13A, 13B, 13C, and 13D are diagrams illustrating modifications of the electric device having a movable electrode.

FIG. 13A illustrates a Γ type impedance matching circuit. A variable inductor VL is serially connected to the radio frequency line, and a variable capacitor VC is connected between the radio frequency line and the ground.

Figure 13B:
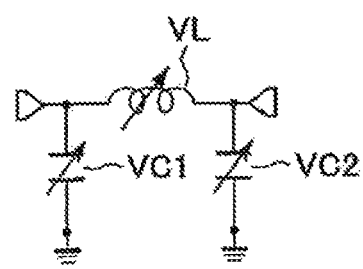

FIG. 13B illustrates a Π type impedance matching circuit. Variable capacitors VC1 and VC2 are connected between both sides of a variable inductor VL and the ground.

Figure 13C:
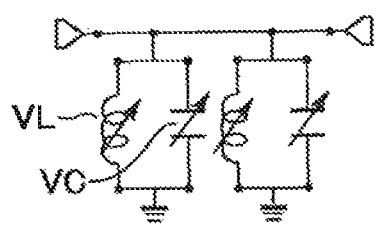

FIG. 13C illustrates an example of a variable band-pass filter. An arbitrary number of parallel connection of variable inductor VL and variable capacitor VC are connected between the radio frequency line and the ground.

Figure 13D:
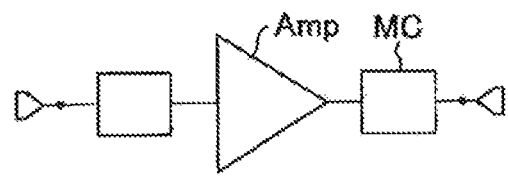

FIG. 13D illustrates a variable amplifier. An impedance matching circuit MC is connected to the output side of the receiving or transmitting amplifier. Frequency characteristics, etc. may be adjusted by this variable amplifier.

Figure 14A:
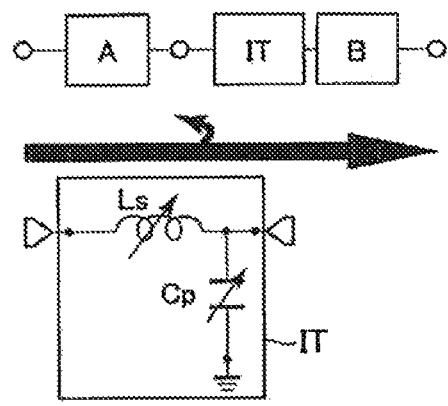
FIGS. 14A and 14B are diagrams for explaining impedance matching conducted by using the electric device having a movable electrode.

FIG. 14A illustrates a structure wherein an impedance matching circuit IT is connected between a circuit section A and a circuit section B. The impedance matching circuit IT is, for example, the Γ-type circuit illustrated in FIG. 13A.

Figure 14B:
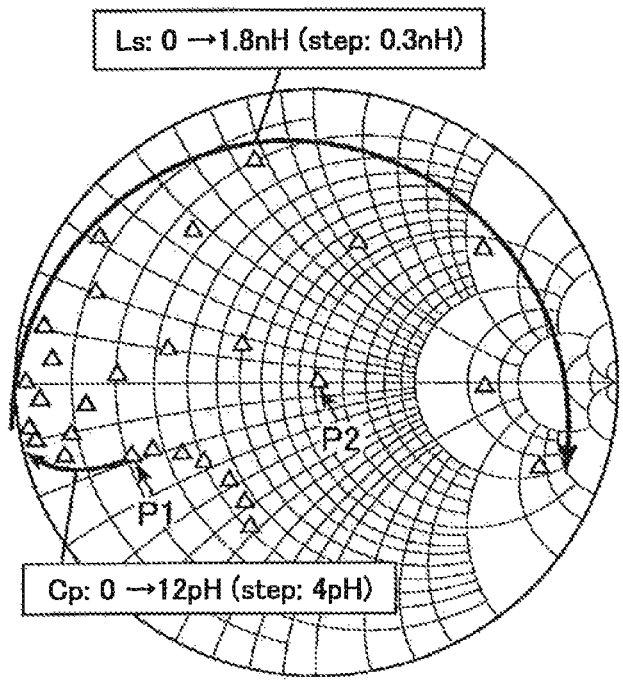

FIG. 14B is a chart illustrating the impedance matching for changing the characteristics P1 to characteristics P2.

Figure 15:
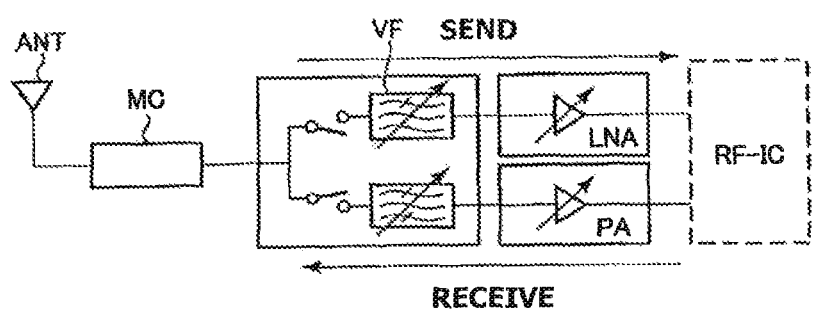
FIG. 15 is an equivalent circuit diagram illustrating an example structure of the tunable RF front end.
Figure 16A:
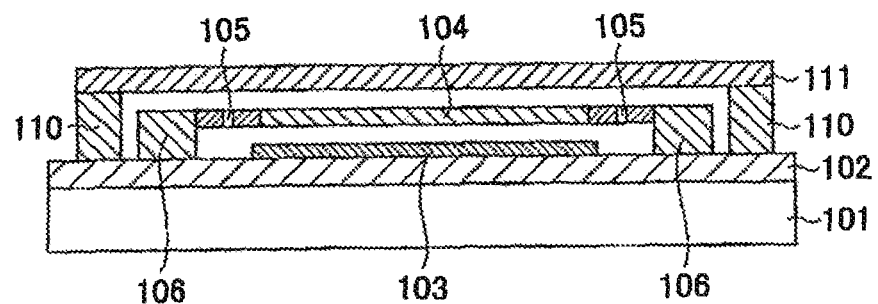
FIGS. 16A and 16B are cross sectional views illustrating an example structure of the variable capacitance element according to prior art.
Figure 16B:
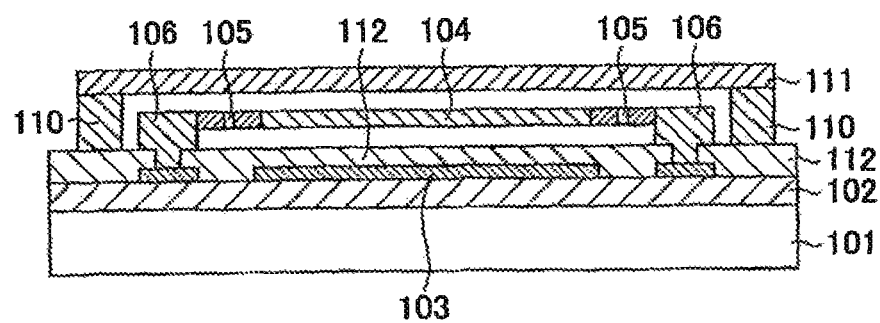

FIG. 15 is an equivalent circuit diagram illustrating an example structure of a tunable RF front end. A variable filter VF is connected to an antenna ANT via an impedance matching circuit MC. In receiving circuit, a low noise amplifier LNA is connected to a variable filter, and amplified signals are supplied to a radio frequency IC (RF-IC). In transmission circuit, signal from a RF-IC is supplied to a power amplifier PA, and amplified signal is supplied to the antenna ANT through the variable filter VF and the impedance matching circuit MC.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention. For example, the steps illustrated in FIGS. 4A to 4L may be conducted by substituting the SOI substrate with a laminate substrate having two sacrificial layers of different etching characteristics provided on a support substrate to produce the structure as illustrated in FIG. 2A. In such a case, the bonding silicon oxide film 52 and the active silicon layer 53 illustrated in FIG. 2A may constitute the sacrificial layers of different etching characteristics. A laminate substrate having a single sacrificial layer on a support substrate may also be used by utilizing controlled etching etc. It is also possible to incorporate various known prior art techniques.

The invention claimed is:

1. A movable electric device comprising:
   a support substrate having a surface;
   first and second fixed electrodes formed on the support substrate, and having opposing electrode surfaces which are substantially perpendicular to the surface of the support substrate, and define a cavity therebetween;
   a movable member having
      a movable electrode having a first end disposed near the first fixed electrode and a second end disposed near the second fixed electrode, and
      bent spring member continuing from at least one of the first and second ends of the movable electrode, and including part which is bent in thickness direction of the movable electrode; and
   first and second anchors disposed on the support substrate and supporting the movable member at its opposite ends.

2. The movable electric device according to claim 1, wherein the bent spring member of the movable member includes
   a first bent spring member continuing from the first end of the movable electrode which is bent in the thickness direction of the movable electrode, and
   a second bent spring member continuing from the second end of the movable electrode which is bent in the thickness direction of the movable electrode.

3. The movable electric device according to claim 2, wherein the first and the second bent spring members are respectively bent in the direction leaving the first and the second fixed electrodes in the vicinity, then in the backward direction toward the fixed electrodes, and then in the direction parallel to the extension of the movable electrode.

4. The movable electric device according to claim 2, further comprising:
   a wiring for applying driving voltage between the movable electrode and the first or the second fixed electrode.

5. The movable electric device according to claim 3, further comprising:
   first stopper formed between the first end of the movable electrode and the second fixed electrode, and restricting such movement of the first end of the movable electrode that the first end tends to depart from the first fixed electrode and approach the second fixed electrode, and
   second stopper formed between the second end of the movable electrode and the first fixed electrode, and restricting such movement of the second end of the movable electrode that tends to depart from the second fixed electrode and approach the first fixed electrode.

6. The movable electric device according to claim 2, wherein the movable electrode and the first and second bent spring members are formed of a metal sheet.

7. The movable electric device according to claim 6, further comprising:
   an insulation layer covering the surfaces of the first and second fixed electrodes opposing the movable electrode, wherein the movable electric device constitutes a variable capacitance.

8. The movable electric device according to claim 2, wherein the first fixed electrode is divided into a plurality of sections, further comprising:
   an insulation layer covering surface of each section opposing the movable electrode; and
   a contact disposed between the adjacent sections covered by the insulation layer;
   wherein the movable electric device constitutes a switch element.

9. The movable electric device according to claim 8, wherein the first fixed electrode is divided into at least three sections, and at least two contacts are disposed between the sections to constitute a variable inductor.

10. The movable electric device according to claim 9, wherein the at least two contacts are short-circuited by a conductor having an inductance lower than the movable electrode.

11. The movable electric device according to claim 9, further comprising:
    at least three serially connected inductances, wherein the at least two contacts are connected to interconnection points of the at least three serially connected inductances.

12. The movable electric device according to claim 1, wherein the bent spring member continues to the first anchor, and end continuing to the movable electrode is displaced in width direction of the cavity between the first and second fixed electrodes by a distance at least ⅓ of a distance in the width direction between the end continuing to the first anchor and the near fixed electrode.

13. The movable electric device according to claim 1, wherein the bent spring member continues to the second anchor, and end continuing to the movable electrode is displaced in a width direction of the cavity between the first and second fixed electrodes by a distance at least ⅓ of a distance in the width direction between the end continuing to the second anchor and the near fixed electrode.

* * * * *